US012751267B2

(12) United States Patent
Yoo et al.

(10) Patent No.: US 12,751,267 B2
(45) Date of Patent: Sep. 29, 2026

(54) SEMICONDUCTOR DEVICE INCLUDING UPPER AND LOWER WIRING STRUCTURE AND METHOD FOR FABRICATING THEREOF

(71) Applicant: Samsung Electronics Co., Ltd., Suwon-si (KR)

(72) Inventors: Seung Yong Yoo, Suwon-si (KR); Eun-Ji Jung, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 467 days.

(21) Appl. No.: 18/351,779

(22) Filed: Jul. 13, 2023

(65) Prior Publication Data

US 2024/0153848 A1 May 9, 2024

(30) Foreign Application Priority Data

Nov. 8, 2022 (KR) ........................ 10-2022-0147860
Feb. 21, 2023 (KR) ........................ 10-2023-0022636

(51) Int. Cl.
*H10W 20/20* (2026.01)
*H10W 20/00* (2026.01)
(Continued)

(52) U.S. Cl.
CPC .................................. *H10W 20/20* (2026.01)

(58) Field of Classification Search
CPC ............. H01L 23/481; H01L 21/76805; H01L 21/76807; H01L 21/76843; H01L 21/76844; H01L 21/7682; H01L 23/53238; H01L 21/76849; H01L 23/5226; H10W 20/20; H10W 20/425; H10W 20/033; H10W 20/034; H10W 20/037; H10W 20/42; H10W 20/072; H10W 20/083; H10W 20/084; H10W 20/46
See application file for complete search history.

(56) References Cited

U.S. PATENT DOCUMENTS 9,349,689 B2 5/2016 Yang et al.
9,812,390 B2 11/2017 Yang et al.
(Continued)

FOREIGN PATENT DOCUMENTS

KR 101506352 B1 3/2015

*Primary Examiner* — Herve-Louis Y Assouman
(74) *Attorney, Agent, or Firm* — Harness, Dickey & Pierce, P.L.C.

(57) ABSTRACT

A semiconductor device may include an upper interlayer insulating film on a lower wiring structure and an upper wiring structure in an upper wiring trench of the upper interlayer insulating film. The lower wiring structure may include a lower filling film and a lower capping film including a capping opening exposing a portion of the lower filling film. The upper wiring structure may contact the lower filling film. The upper wiring structure may include an upper liner between an upper barrier film and an upper filling film. A sidewall portion of the upper liner may include cobalt doped with ruthenium. A bottom portion of the upper liner may not include cobalt doped with ruthenium. A sidewall portion of the upper barrier film may include tantalum nitride doped with ruthenium (Ru). A sidewall portion of the upper barrier film may not be in contact with the lower capping film.

20 Claims, 33 Drawing Sheets

(51) Int. Cl.

| | |
|---|---|
| ***H10W 20/41*** | (2026.01) |
| ***H10W 20/42*** | (2026.01) |
| ***H10W 20/46*** | (2026.01) |

(56) References Cited

U.S. PATENT DOCUMENTS

| | | | | |
|---|---|---|---|---|
| 11,282,742 | B2 | 3/2022 | Shih et al. | |
| 11,328,991 | B2 | 5/2022 | Huang et al. | |
| 11,342,222 | B2 | 5/2022 | Hsueh et al. | |
| 2018/0211872 | A1* | 7/2018 | Wu | H01L 21/76876 |
| 2018/0261544 | A1* | 9/2018 | Kim | H01L 23/53223 |
| 2020/0058544 | A1* | 2/2020 | Chou | H01L 21/76843 |
| 2021/0287994 | A1* | 9/2021 | Hsueh | H01L 21/76814 |
| 2021/0391275 | A1* | 12/2021 | Kuo | H01L 23/53238 |
| 2022/0173042 | A1 | 6/2022 | Ho et al. | |
| 2022/0285210 | A1 | 9/2022 | Lin et al. | |

* cited by examiner

SEMICONDUCTOR DEVICE INCLUDING UPPER AND LOWER WIRING STRUCTURE AND METHOD FOR FABRICATING THEREOF

CROSS-REFERENCE TO RELATED APPLICATION

This application claims priority from Korean Patent Application No. 10-2022-0147860 filed on Nov. 8, 2022 and Korean Patent Application No. 10-2023-0022636 filed on Feb. 21, 2023 in the Korean Intellectual Property Office, and all the benefits accruing therefrom under 35 U.S.C. 119, the contents of each of which in its entirety are herein incorporated by reference.

BACKGROUND

Technical Field

The present disclosure relates to a semiconductor device and a method for fabricating thereof, and more particularly, to a semiconductor device including wiring lines formed in a back-end-of-line (BEOL) process, and a method for fabricating thereof.

Description of the Related Art

With the development of electronic technology, as down-scaling of semiconductor elements is rapidly progressing in recent years, high integration and low power consumption of semiconductor chips are required. In order to respond to demands for high integration and low power consumption of the semiconductor chips, feature sizes of semiconductor devices are continuously decreasing.

On the other hand, as the feature size decreases, various studies are being conducted on a stable connection method between wirings.

SUMMARY

Aspects of the present disclosure provide a semiconductor device capable of improving performance and reliability of an element.

Aspects of the present disclosure provide a method for fabricating a semiconductor device capable of improving performance and reliability of an element.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an example embodiment, a semiconductor device may include a lower interlayer insulating film; a lower wiring structure in the lower interlayer insulating film, the lower wiring structure including a lower filling film and a lower capping film, the lower capping film including an upper surface and a bottom surface opposite each other, and the bottom surface of the lower capping film being in contact with an upper surface of the lower filling film; an etch stop film on the lower interlayer insulating film, the etch stop film in contact with an upper surface of the lower interlayer insulating film and the upper surface of the lower capping film; an upper interlayer insulating film on the etch stop film, the upper interlayer insulating film including an upper wiring trench; and an upper wiring structure in the upper wiring trench and in contact with the lower filling film. The upper wiring structure may include an upper barrier film, an upper filling film, and an upper liner between the upper barrier film and the upper filling film. The upper liner may include a sidewall portion and a bottom portion. The sidewall portion of the upper liner may extend along a sidewall of the upper wiring trench. The bottom portion of the upper liner may extend along a bottom surface of the upper wiring trench. The upper liner may include cobalt (Co). The upper barrier film may include a sidewall portion extending along the sidewall of the upper wiring trench. The sidewall portion of the upper barrier film may include tantalum nitride doped with ruthenium (Ru).

According to an example embodiment, a semiconductor package may include a lower wiring structure including a lower filling film and a lower capping film, an upper surface of the lower filling film including a first region in contact with the lower capping film and a second region that is not in contact with the lower capping film; an upper interlayer insulating film on the lower wiring structure and including an upper wiring trench, the upper wiring trench including an upper wiring line trench and an upper via trench on a bottom surface of the upper wiring line trench, and a bottom surface of the upper via trench overlapping the second region of the upper surface of the lower filling film; and an upper wiring structure in the upper wiring trench, the upper wiring structure including an upper barrier structure and an upper filling film on the upper barrier structure. The upper barrier structure may include a sidewall portion and a bottom portion. The sidewall portion of the upper barrier structure may extend along sidewalls of the upper wiring line trench, a bottom surface of the upper wiring line trench, and sidewalls of the upper via trench. The bottom portion of the upper barrier structure may extend along a bottom surface of the upper via trench. The upper barrier structure may include an upper barrier film and an upper liner between the upper barrier film and the upper filling film. The upper liner may include cobalt. The sidewall portion of the upper barrier structure may include tantalum nitride (TaN) doped with ruthenium (Ru). The bottom portion of the upper barrier structure may not include tantalum nitride doped with ruthenium.

According to an example embodiment, a semiconductor package may include a lower wiring structure including a lower filling film and a lower capping film, the lower capping film including a capping opening exposing a portion of an upper surface of the lower filling film; an upper interlayer insulating film on the lower wiring structure, the upper interlayer insulating film including an upper wiring trench; and an upper wiring structure in the upper wiring trench, the upper wiring structure in contact with the upper surface of the lower filling film. The upper wiring structure may include an upper barrier film, an upper filling film, and an upper liner between the upper barrier film and the upper filling film. The upper liner may include a sidewall portion extending along sidewalls of the upper wiring trench and a bottom portion extending along a bottom surface of the upper wiring trench. The sidewall portion of the upper liner may include cobalt doped with ruthenium. The bottom portion of the upper liner may not include cobalt doped with ruthenium. The upper barrier film may include a sidewall portion extending along the sidewalls of the upper wiring trench. The sidewall portion of the upper barrier film may include tantalum nitride doped with ruthenium (Ru). The sidewall portion of the upper barrier film may not be in contact with the lower capping film.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION

Figure 1:
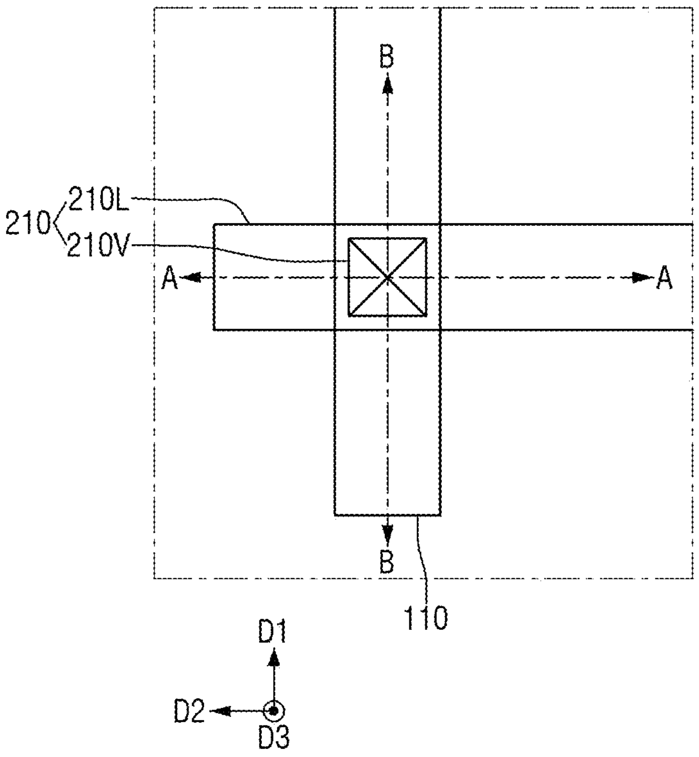
FIG. 1 is an example layout view for describing a semiconductor device according to some example embodiments.

In the drawings of a semiconductor device according to some embodiments, for example, a fin-type transistor (FinFET) including a channel region having a fin-type pattern shape, a transistor including nanowires or nanosheets, a multi-bridge channel field effect transistor (MBCFET™), or vertical FET is illustrated, but the present disclosure is not limited thereto. The semiconductor device according to some example embodiments may include other types of semiconductor devices, such as a tunneling FET or a three-dimensional (3D) transistor. Also, the semiconductor device according to some example embodiments may include a planar transistor. In addition, technical ideas of the present disclosure may be applied to two-dimensional (2D) material based FETs and a heterostructure thereof.

In addition, the semiconductor device according to some example embodiments may also include a bipolar junction transistor, a lateral double-diffused metal oxide semiconductor (LDMOS) transistor, or the like.

Figure 2:
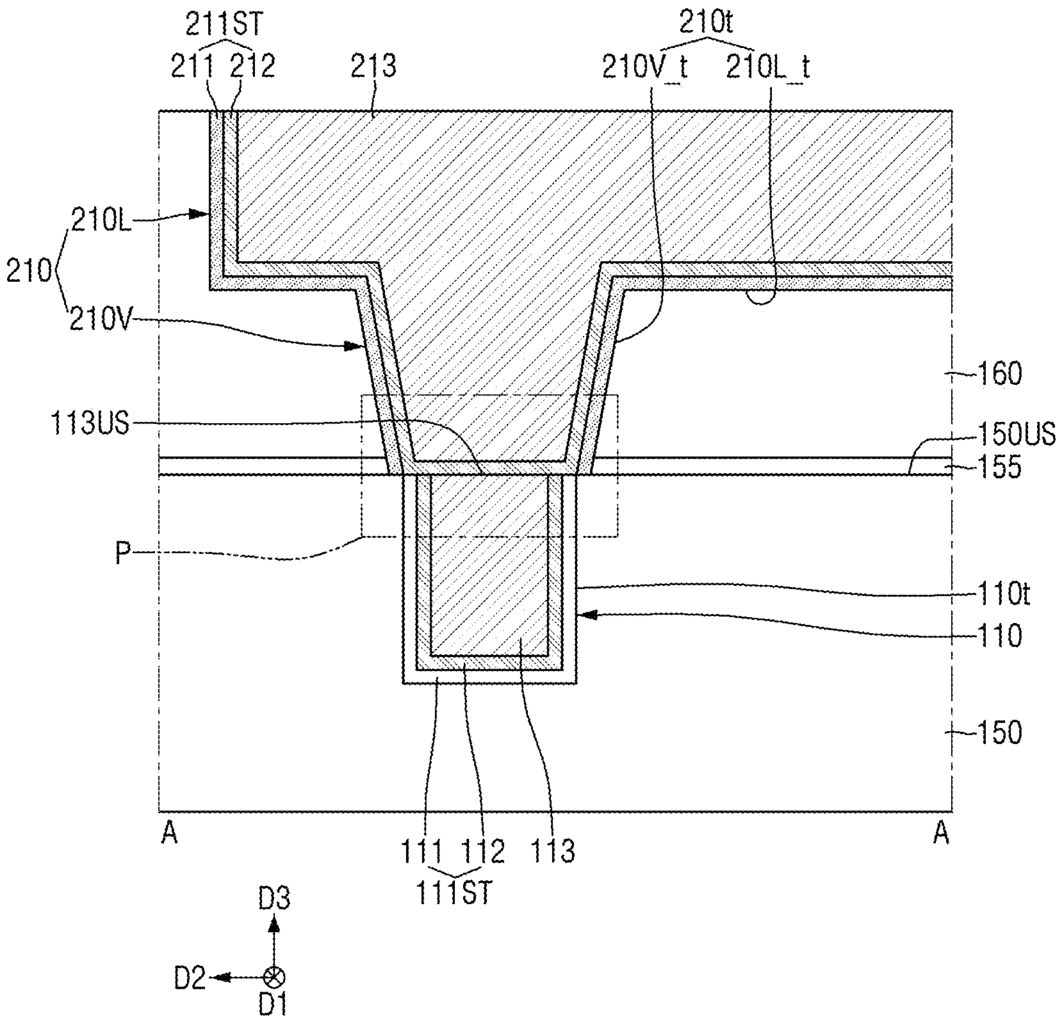
FIG. 2 is an example cross-sectional view taken along line A-A of FIG. 1.
Figure 3:
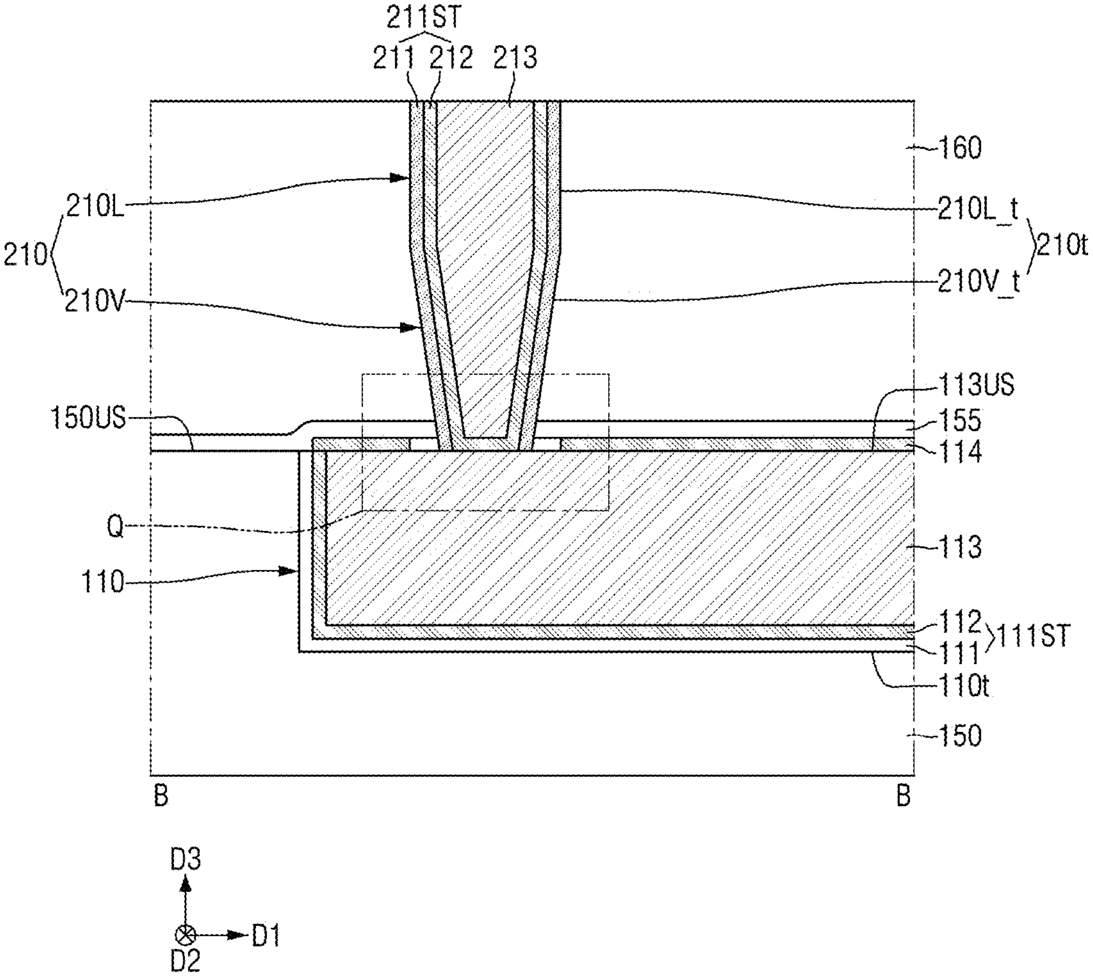
FIG. 3 is an example cross-sectional view taken along line B-B of FIG. 1.
Figure 4:
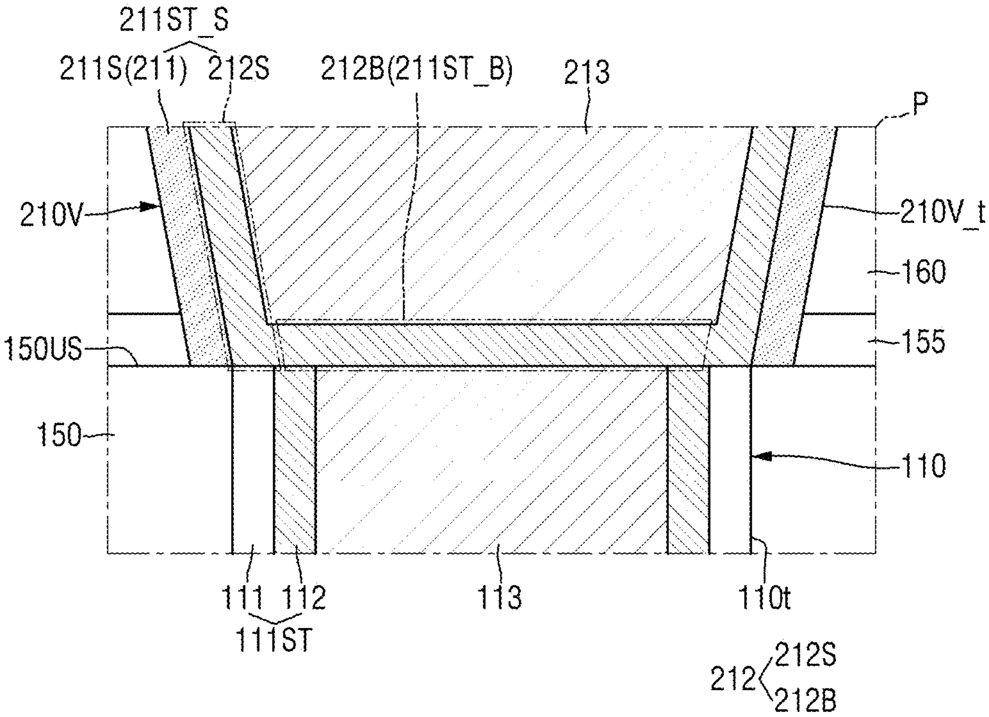
FIG. 4 is an enlarged view of part P of FIG. 2.
Figure 5:
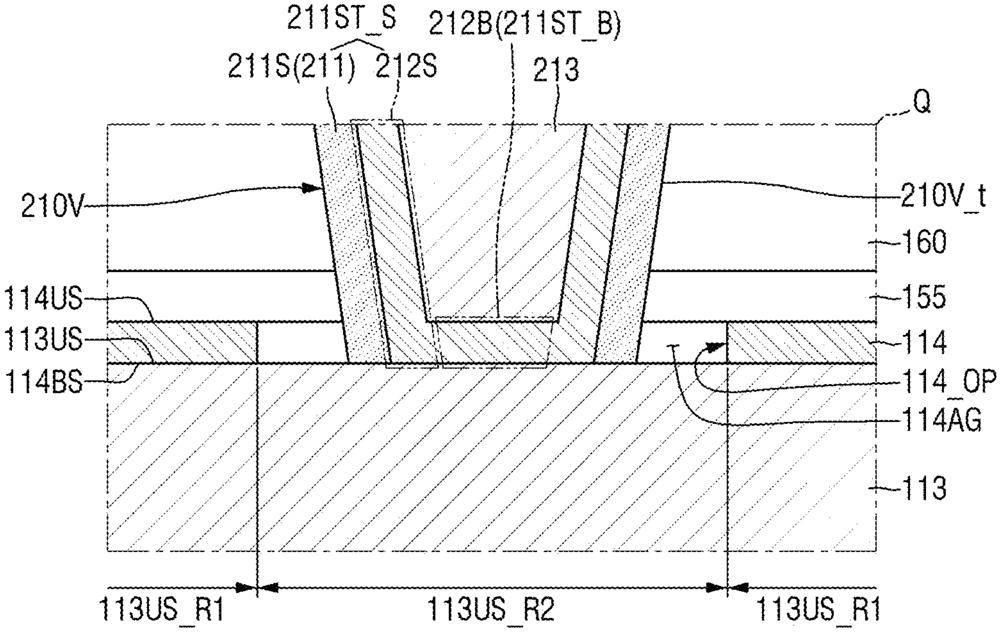
FIG. 5 is an enlarged view of part Q of FIG. 3.

FIG. 1 is an example layout view for describing a semiconductor device according to some example embodiments. FIG. 2 is an example cross-sectional view taken along line A-A of FIG. 1. FIG. 3 is an example cross-sectional view taken along line B-B of FIG. 1. FIG. 4 is an enlarged view of part P of FIG. 2. FIG. 5 is an enlarged view of part Q of FIG. 3.

Referring to 1 to 5, the semiconductor device according to some example embodiments may include a lower wiring structure 110 and an upper wiring structure 210.

The lower wiring structure 110 may be disposed in a first interlayer insulating film 150. The lower wiring structure 110 may extend to be elongated in a first direction D1.

The lower wiring structure 110 may have a line shape extending in the first direction D1. For example, the first direction D1 may be a length direction of the lower wiring structure 110, and a second direction D2 may be a width direction of the lower wiring structure 110. Here, the first direction D1 intersects the second direction D2 and a third direction D3. The second direction D2 intersects the third direction D3.

The first interlayer insulating film 150 may cover a gate electrode and a source/drain of a transistor formed in a front-end-of-line (FEOL) process. Alternatively, the first interlayer insulating film 150 may be an interlayer insulating film formed in a back-end-of-line (BEOL) process.

In other words, as an example, the lower wiring structure 110 may be a contact or a contact wiring formed in a middle-of-line (MOL) process. As another example, the lower wiring structure 110 may be a connection wiring formed in the back-end-of-line (BEOL) process. In the following description, the lower wiring structure 110 will be described as the connection wiring formed in the BEOL process.

The first interlayer insulating film 150 may include, for example, at least one of silicon oxide, silicon nitride, silicon oxynitride, and a low-k material. The low-k material may be, for example, silicon oxide with moderately high carbon and hydrogen, and may be a material such as SiCOH. Meanwhile, since carbon is included in the insulating material, a dielectric constant of the insulating material may be lowered. However, in order to further lower the dielectric constant of the insulating material, the insulating material may include pores such as gas-filled or air-filled cavities within the insulating material.

The low-k material may include, for example, fluorinated tetraethylorthosilicate (FTEOS), hydrogen silsesquioxane (HSQ), bis-benzocyclobutene (BCB), tetramethylorthosilicate (TMOS), octamethylcyclotetrasiloxane (OMCTS), hexamethyldisiloxane (HMDS), trimethylsilyl borate (TMSB), diacetoxyditertiarybutosiloxane (DADBS), trimethylsilyl phosphate (TMSP), polytetrafluoroethylene (PTFE), tonen silazene (TOSZ), fluoride silicate glass (FSG), polyimide nanofoams such as polypropylene oxide, carbon doped silicon oxide (CDO), organo silicate glass (OSG), SiLK, amorphous fluorinated carbon, silica aerogels, silica xerogels, mesoporous silica, or a combination thereof, but is not limited thereto.

The lower wiring structure 110 may be disposed at a first metal level. The first interlayer insulating film 150 may include a lower wiring trench 110*t* extending to be elongated in the first direction D1.

The lower wiring structure 110 may be disposed in the lower wiring trench 110*t*. The lower wiring trench 110*t* is filled with the lower wiring structure 110.

The lower wiring structure 110 may include a lower barrier structure 111ST, a lower filling film 113, and a lower capping film 114. The lower filling film 113 may be disposed on the lower barrier structure 111ST. The lower capping film 114 may be disposed on the lower filling film 113.

The lower barrier structure 111ST may include a lower barrier film 111 and a lower liner 112. The lower liner 112 may be disposed between the lower barrier film 111 and the lower filling film 113.

The lower barrier structure 111ST may extend along sidewalls and a bottom surface of the lower wiring trench 110*t*. The lower barrier film 111 may extend along the sidewalls and the bottom surface of the lower wiring trench 110*t*. The lower liner 112 may be disposed on the lower barrier film 111. The lower liner 112 may extend along the sidewalls and the bottom surface of the lower wiring trench 110*t* on the lower barrier film 111.

The lower filling film 113 is disposed on the lower liner 112. The remainder of the lower wiring trench 110*t* may be filled with the lower filling film 113.

The lower capping film 114 is disposed on an upper surface 113US of the lower filling film. The lower capping film 114 may extend along the upper surface 113US of the lower filling film. The lower capping film 114 may be disposed on an upper surface of the lower liner 112. Unlike as illustrated, the lower capping film 114 may not cover the upper surface of the lower liner 112.

The lower capping film 114 may include an upper surface 114US and a bottom surface 114BS opposite to each other in the third direction D3. The bottom surface 114BS of the lower capping film faces the upper surface 113US of the lower filling film. The bottom surface 114BS of the lower capping film may be in contact with the upper surface 113US of the lower filling film.

The upper surface 113US of the lower filling film may include a first region 113US_R1 and a second region 113US_R2. The first region 113US_R1 of the upper surface of the lower filling film is a region covered by the lower capping film 114. The first region 113US_R1 of the upper surface of the lower filling film may be in contact with the lower capping film 114.

The second region 113US_R2 of the upper surface of the lower filling film is a region that is not covered by the lower capping film 114. The second region 113US_R2 of the upper surface of the lower filling film may not be in contact with the lower capping film 114.

In other words, the lower capping film 114 may include a capping opening 114_OP exposing a portion of the upper surface 113US of the lower filling film. The second region 113US_R2 of the upper surface of the lower filling film may be exposed by the capping opening 114_OP.

When the lower liner 112 and the lower capping film 114 are formed of the same material, the upper surface of the lower liner 112 may not be distinguished at a boundary between the lower liner 112 and the lower capping film 114.

The lower capping film 114 may not cover an upper surface of the lower barrier film 111. Unlike as illustrated, the lower capping film 114 may cover at least a portion of the upper surface of the lower barrier film 111.

The upper surface of the lower liner 112 is illustrated as being coplanar with the upper surface 113US of the lower filling film and the upper surface of the lower barrier film 111, but is not limited thereto. Here, the upper surface of the lower liner 112 may refer to the uppermost surface of a portion of the lower liner 112 extending along the sidewall of the lower wiring trench 110*t*.

The lower barrier film 111 may include a conductive material, for example, metal nitride. The lower barrier film 111 may include, for example, at least one of tantalum nitride (TaN), titanium nitride (TiN), tungsten nitride (WN), zirconium nitride (ZrN), vanadium nitride (VN), and niobium nitride (NbN). As an example, the lower barrier film 111 may include tantalum nitride (TaN). As another example, the lower barrier film 111 may include tantalum nitride doped with ruthenium (Ru).

The lower liner 112 may include a conductive material, for example, a metal. The lower liner 112 may include, for example, cobalt (Co) or cobalt doped with ruthenium.

In the semiconductor device according to some example embodiments, the lower liner 112 may be formed of cobalt (Co). For example, the lower liner 112 may be formed of cobalt. Here, the "cobalt film" may also be a film formed purely of cobalt, and may also be a film including impurities introduced in a process of forming the cobalt film.

The lower filling film 113 may include a conductive material, for example, at least one of aluminum (Al), copper (Cu), tungsten (W), cobalt (Co), ruthenium (Ru), silver (Ag), gold (Au), manganese (Mn), molybdenum (Mo), rhodium (Rh), iridium (Ir), RuAl, NiAl, $NbB_2$, $MoB_2$, $TaB_2$, $V_2AlC$, and CrAlC. In the semiconductor device according to some example embodiments, the lower filling film 113 may include copper (Cu).

The lower capping film 114 may include a conductive material, for example, a metal. The lower capping film 114 may include cobalt (Co). In the semiconductor device according to some example embodiments, the lower capping film 114 may be formed of cobalt (Co).

Unlike as illustrated, the lower wiring structure 110 may have a single-film structure. Although not illustrated, a via pattern connecting the conductive patterns disposed on a lower side of the lower wiring structure 110 may be further included.

The lower wiring structure 110 may be formed using, for example, a damascene method. In FIG. 2, a width of the lower wiring structure 110 in the second direction D2 is illustrated as being constant, but is not limited thereto. Unlike as illustrated, as a distance from the upper surface of the first interlayer insulating film 150 increases, the width of the lower wiring structure 110 in the second direction D2 may decrease.

A first etch stop film 155 may be disposed on the lower wiring structure 110 and the first interlayer insulating film 150. The first etch stop film 155 may be in contact with the upper surface 150US of the first interlayer insulating film and the upper surface 114US of the lower capping film.

In the semiconductor device according to some example embodiments, the lower capping film 114 may be undercut to a lower portion of the first etch stop film 155. In other words, the first etch stop film 155 may cover a portion of the second region 113US_R2 of the upper surface of the lower filling film. The first etch stop film 155 may cover a portion of the second region 113US_R2 of the upper surface of the lower filling film in the third direction D3.

For example, a capping air gap 114AG may be disposed in a region where the lower capping film 114 is undercut. The capping air gap 114AG may be disposed between the first etch stop film 155 and the lower filling film 113. Unlike as illustrated, at least a portion of the region where the lower capping film 114 is undercut may be filled with an insulating material.

A second interlayer insulating film 160 may be disposed on the first etch stop film 155. The first etch stop film 155 may be disposed between the first interlayer insulating film 150 and the second interlayer insulating film 160.

The second interlayer insulating film 160 may include an upper wiring trench 210*t*. The upper wiring trench 210*t* may penetrate through the first etch stop film 155. The upper wiring trench 210*t* exposes a portion of the lower wiring structure 110.

The upper wiring trench 210*t* penetrates through the lower capping film 114. The upper wiring trench 210*t* exposes a portion of the upper surface 113US of the lower filling film.

The upper wiring trench 210*t* includes an upper via trench 210V_t and an upper wiring line trench 210L_t. The upper wiring line trench 210L_t may extend to be elongated in the second direction D2. The upper wiring line trench 210L_t may extend up to an upper surface of the second interlayer insulating film 160. The upper via trench 210V_t may be formed on a bottom surface of the upper wiring line trench 210L_t.

For example, a bottom surface of the upper wiring trench 210*t* may be a bottom surface of the upper via trench 210V_t. The bottom surface of the upper wiring trench 210*t* may be defined by the upper surface 113US of the lower filling film. For example, the bottom surface of the upper wiring trench 210*t* may be defined by at least a portion of the second region 113US_R2 on the upper surface of the lower filling film.

Sidewalls of the upper wiring trench 210*t* may include sidewalls and a bottom surface of the upper wiring line trench 210L_t and sidewalls of the upper via trench 210V_t. The sidewalls and the bottom surface of the upper wiring line trench 210L_t may be defined by the second interlayer insulating film 160. The sidewalls of the upper via trench 210V_t may be defined by the second interlayer insulating film 160 and the first etch stop film 155.

The second interlayer insulating film 160 may include, for example, at least one of silicon oxide, silicon nitride, silicon oxynitride, and a low-k material.

The first etch stop film 155 may include a material having an etch selectivity with respect to the second interlayer insulating film 160. The first etch stop film 155 may include, for example, at least one of silicon nitride (SiN), silicon oxynitride (SiON), silicon oxycarbonitride (SiOCN), silicon boron nitride (SiBN), silicon oxyboron nitride (SiOBN), silicon oxycarbide (SiOC), aluminum oxide (AlO), aluminum nitride (AlN), aluminum oxycarbide (AlOC), and a combination thereof.

The first etch stop film 155 is illustrated as being a single film, but this is only for convenience of explanation and the present disclosure is not limited thereto. Unlike as illustrated, the first etch stop film 155 may include a plurality of insulating films sequentially stacked on the first interlayer insulating film 150.

The upper wiring structure 210 may be disposed in the upper wiring trench 210*t*. The upper wiring trench 210*t* may be filled with the upper wiring structure 210. The upper wiring structure 210 may be disposed in the second interlayer insulating film 160.

The upper wiring structure 210 is disposed on the lower wiring structure 110. The upper wiring structure 210 is connected to the lower wiring structure 110. The upper wiring structure 210 is in contact with the lower wiring structure 110. The upper wiring structure 210 is in contact with the lower filling film 113. For example, the upper wiring structure 210 is in contact with the second region 113US_R2 of the upper surface of the lower filling film.

The upper wiring structure 210 includes an upper wiring line 210L and an upper via 210V. The upper via 210V connects the upper wiring line 210L and the lower wiring structure 110. The upper via 210V is in contact with the lower filling film 113. The upper via 210V is in contact with the second region 113US_R2 of the upper surface of the lower filling film. The upper via 210V penetrates through the capping opening 114_OP and is in contact with the lower filling film 113.

When a portion of the lower capping film 114 is etched to expose the second region 113US_R2 of the upper surface of the lower filling film, the lower filling film 113 may not be removed by an etching process. The first region 113US_R1 of the upper surface of the lower filling film may be coplanar with the second region 113US_R2 of the upper surface of the lower filling film. In a cross-sectional view as illustrated in FIG. 3, the upper surface 113US of the lower filling film in contact with the upper wiring structure 210 may have a planar shape.

The upper via trench 210V_t and the upper wiring line trench 210L_t are filled with the upper wiring structure 210. The upper wiring line 210L is disposed in the upper wiring line trench 210L_t. The upper via 210V is disposed in the upper via trench 210V_t.

The upper wiring line 210L is disposed at a second metal level different from the first metal level. The upper wiring line 210L is disposed at a second metal level higher than the first metal level.

The upper wiring structure 210 includes an upper barrier structure 211ST and an upper filling film 213. The upper filling film 213 is disposed on the upper barrier structure 211ST. The upper barrier structure 211ST includes an upper barrier film 211 and an upper liner 212. Although not illustrated, the upper wiring structure 210 may include an upper capping film such as the lower capping film 114.

The upper barrier structure 211ST may extend along sidewalls and a bottom surface of the upper wiring trench 210*t*. The upper barrier structure 211ST may include a sidewall portion 211St_S and a bottom portion 211ST_B.

The sidewall portion 211ST_S of the upper barrier structure extends along the sidewalls and the bottom surface of the upper wiring line trench 210L_t and the sidewalls of the upper via trench 210V_t. The bottom portion 211ST_B of the upper barrier structure extends along the bottom surface of the upper via trench 210V_t.

The upper barrier film 211 extends along the sidewalls of the upper wiring trench 210*t*. The upper barrier film 211 does not extend along the bottom surface of the upper wiring trench 210*t*. The upper barrier film 211 does not cover the entirety of the lower wiring structure 110 exposed by the upper via trench 210V_t.

The upper barrier film 211 extends along the sidewalls and the bottom surface of the upper wiring line trench 210L_t and the sidewalls of the upper via trench 210V_t. The upper barrier film 211 may extend up to the lower wiring structure 110 defining the bottom surface of the upper wiring trench 210*t*.

In the semiconductor device according to some example embodiments, the upper barrier film 211 extends up to the upper surface 113US of the lower filling film. The upper barrier film 211 may be in contact with the upper surface 113US of the lower filling film.

The upper barrier film 211 may include a sidewall portion 211S extending along the sidewalls of the upper wiring trench 210*t*. In the semiconductor device according to some example embodiments, the upper barrier film 211 may not include the bottom portion extending along the bottom surface of the upper wiring trench 210*t*. In other words, the upper barrier film 211 may include only the sidewall portion 211S of the upper barrier film extending along the sidewalls and the bottom surface of the upper wiring line trench 210L_t and the sidewalls of the upper via trench 210V_t.

In the cross-sectional views as illustrated in FIGS. 3 and 5, for example, the sidewall portion 211S of the upper barrier film may not be in contact with the lower capping film 114.

The upper barrier film 211 may include a conductive material, for example, metal nitride. The upper barrier film 211 may include, for example, tantalum nitride (TaN) doped with ruthenium (Ru). In the semiconductor device according to some example embodiments, the upper barrier film 211 may be formed of tantalum nitride (TaN) doped with ruthenium (Ru). The sidewall portion 211S of the upper barrier film may be formed of doped tantalum nitride (TaN).

The upper liner 212 is disposed on the upper barrier film 211. The upper liner 212 is disposed between the upper barrier film 211 and the upper filling film 213. For example, the upper liner 212 may be in contact with the upper barrier film 211.

The upper liner 212 extends along the sidewalls and the bottom surface of the upper wiring trench 210*t*. The upper liner 212 extends along the sidewalls and the bottom surface of the upper wiring line trench 210L_t and the sidewalls and the bottom surface of the upper via trench 210V_t.

The upper liner 212 includes a sidewall portion 212S and a bottom portion 212B. The sidewall portion 212S of the upper liner extends along the sidewalls of the upper wiring trench 210*t*. The sidewall portion 212S of the upper liner extends along the sidewalls and the bottom surface of the upper wiring line trench 210L_t and the sidewalls of the upper via trench 210V_t.

In the semiconductor device according to some example embodiments, the sidewall portion 212S of the upper liner may extend up to the upper surface 113US of the lower filling film. The sidewall portion 212S of the upper liner may be in contact with the upper surface 113US of the lower filling film defining the bottom surface of the upper via trench 210V_t.

The bottom portion 212B of the upper liner extends along the bottom surface of the upper wiring trench 210*t*. The bottom portion 212B of the upper liner extends along the bottom surface of the upper wiring trench 210V_t.

In the semiconductor device according to some example embodiments, the bottom portion 212B of the upper liner may be in contact with the upper surface 113US of the lower filling film defining the bottom surface of the upper wiring trench 210*t*.

As an example, the upper liner 212 may include cobalt (Co). For example, the upper liner 212 may be formed of cobalt (Co).

As another example, the upper liner 212 may include cobalt (Co) and cobalt (Co) doped with ruthenium (Ru). For example, the sidewall portion 212S of the upper liner may be formed of cobalt (Co) doped with ruthenium (Ru). The bottom portion 212B of the upper liner may be formed of cobalt (Co). The bottom portion 212B of the upper liner may not include cobalt (Co) doped with ruthenium (Ru).

The sidewall portion 211ST_S of the upper barrier structure may include the sidewall portion 211S of the upper barrier film and the sidewall portion 212S of the upper liner. The bottom portion 211ST_B of the upper barrier structure may include the bottom portion 212B of the upper liner. The bottom portion 211ST_B of the upper barrier structure may not include the upper barrier film 211.

The sidewall portion 211ST_S of the upper barrier structure includes tantalum nitride (TaN) doped with ruthenium (Ru). In the semiconductor device according to some example embodiments, the bottom portion 211ST_B of the upper barrier structure does not include tantalum nitride (TaN) doped with ruthenium (Ru).

The upper filling film 213 is disposed on the upper liner 212. The upper filling film 213 may be in contact with the upper liner 212. The remainder of the upper wiring trench 210*t* may be filled with the upper filling film 213.

The upper filling film 213 may include a conductive material, for example, at least one of aluminum (Al), copper (Cu), tungsten (W), cobalt (Co), ruthenium (Ru), silver (Ag), gold (Au), manganese (Mn), molybdenum (Mo), rhodium (Rh), iridium (Ir), RuAl, NiAl, $NbB_2$, $MoB_2$, $TaB_2$, $V_2AlC$, and CrAlC. In the semiconductor device according to some example embodiments, the upper filling film 213 may include copper (Cu).

Figure 6:
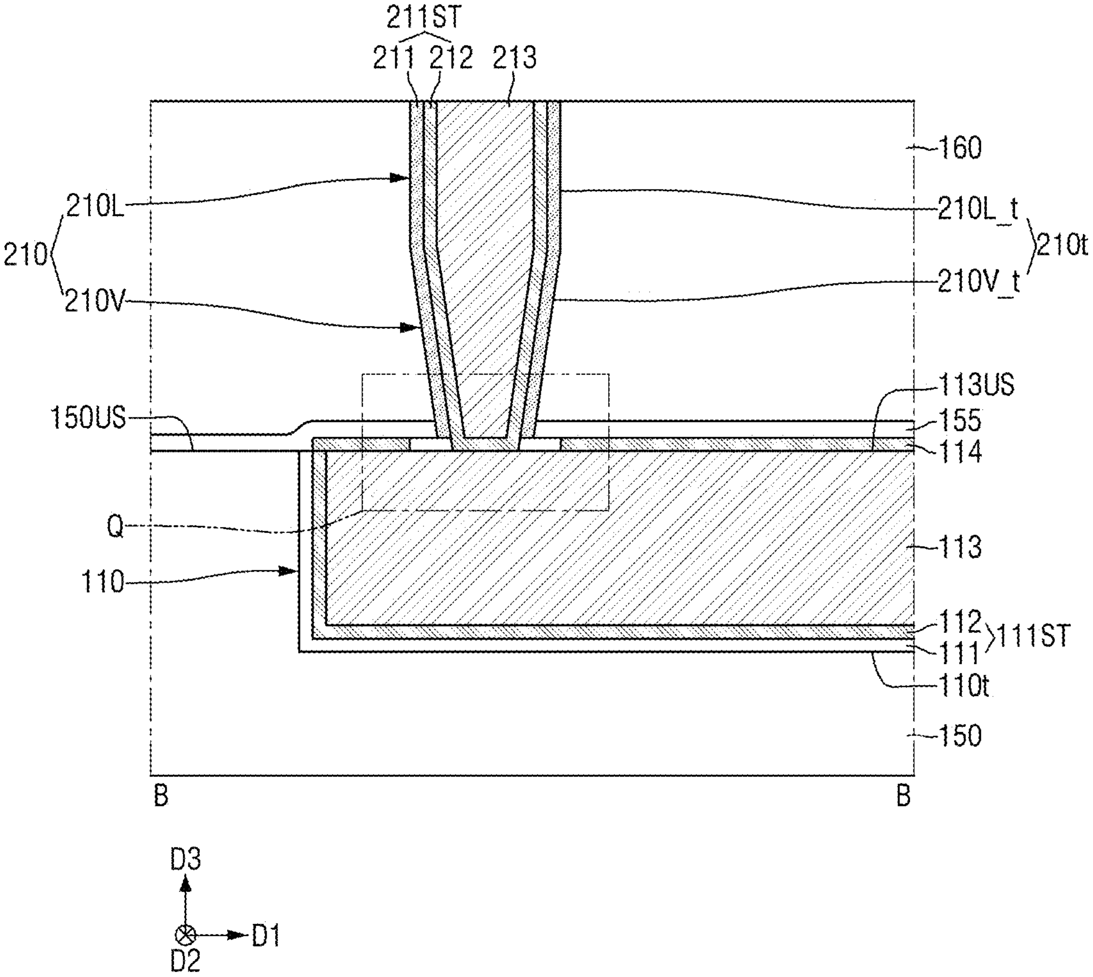
FIGS. 6 and 7 are views for describing a semiconductor device according to some example embodiments.
Figure 7:
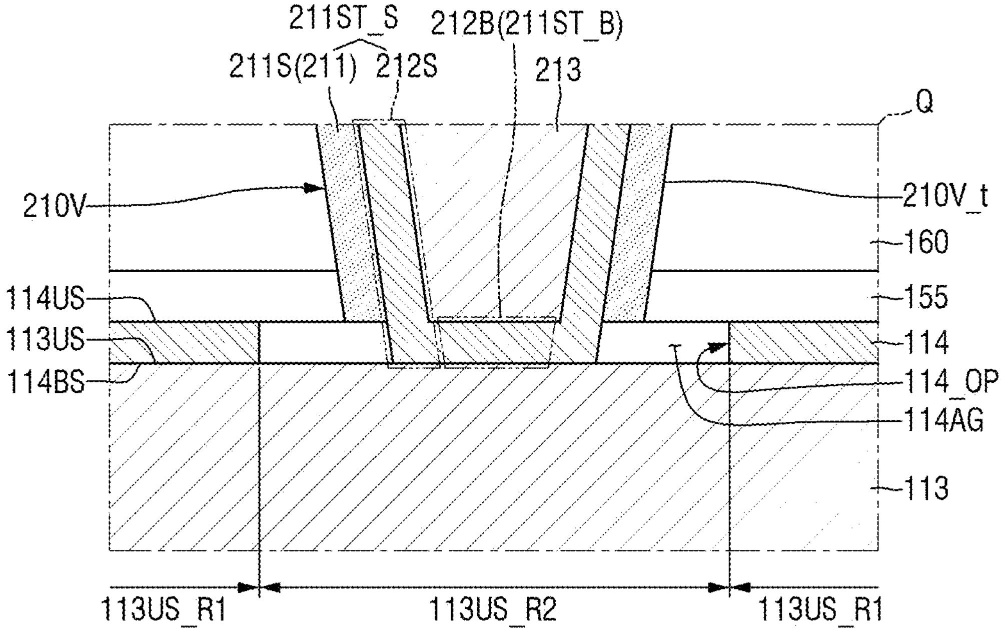
Figure 8:
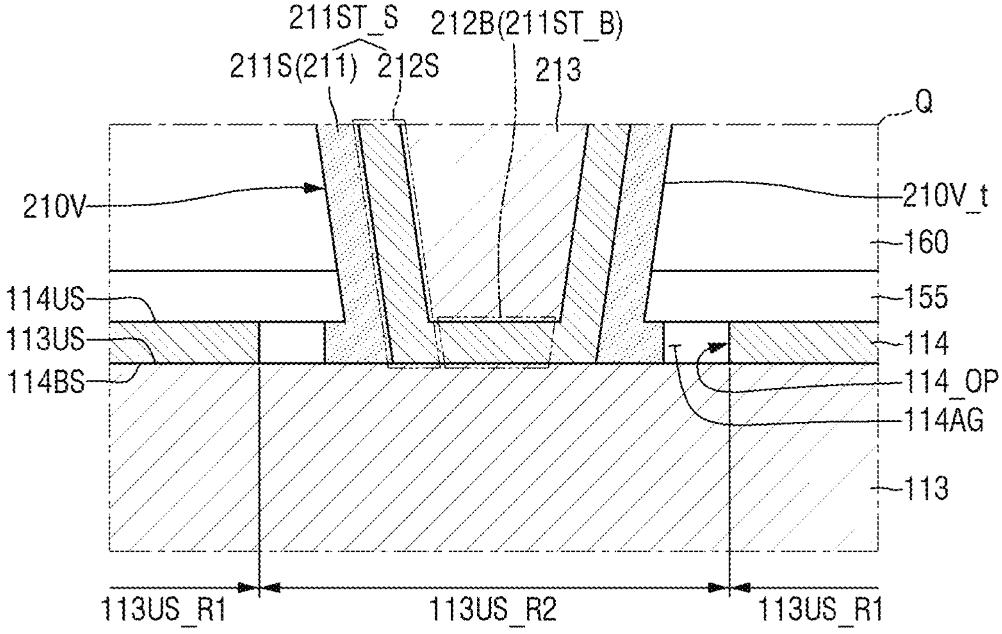
FIG. 8 is a view for describing a semiconductor device according to some example embodiments.

FIGS. 6 and 7 are views for describing a semiconductor device according to some example embodiments. FIG. 8 is a view for describing a semiconductor device according to some example embodiments. For convenience of explanation, points different from those described with reference to FIGS. 1 to 5 will be mainly described. For reference, FIG. 7 is an enlarged view of part Q of FIG. 6. FIG. 8 is an enlarged view of part Q of FIG. 3.

Referring to FIGS. 6 and 7, in the semiconductor device according to some example embodiments, the upper barrier film 211 may not extend up to the upper surface 113US of the lower filling film.

The upper barrier film 211 may not be in contact with the upper surface 113US of the lower filling film. The sidewall portion 211S of the upper barrier film may not be in contact with the upper surface 113US of the lower filling film.

Referring to FIG. 8, in the semiconductor device according to some example embodiments, a portion of the upper barrier film 211 may be disposed in the region where the lower capping film 114 is undercut.

A portion of the upper barrier film 211 may be disposed between the first etch stop film 155 and the lower filling film 113. For example, a portion of the sidewall portion 211S of the upper barrier film may be recessed between the first etch stop film 155 and the lower filling film 113.

Unlike as illustrated, an entirety of the region where the lower capping film 114 is undercut may be filled with the upper barrier film 211.

FIGS. 9 to 12 are views for describing a semiconductor device according to some example embodiments. For convenience of explanation, points different from those described with reference to FIGS. 1 to 5 will be mainly described.

Figure 9:
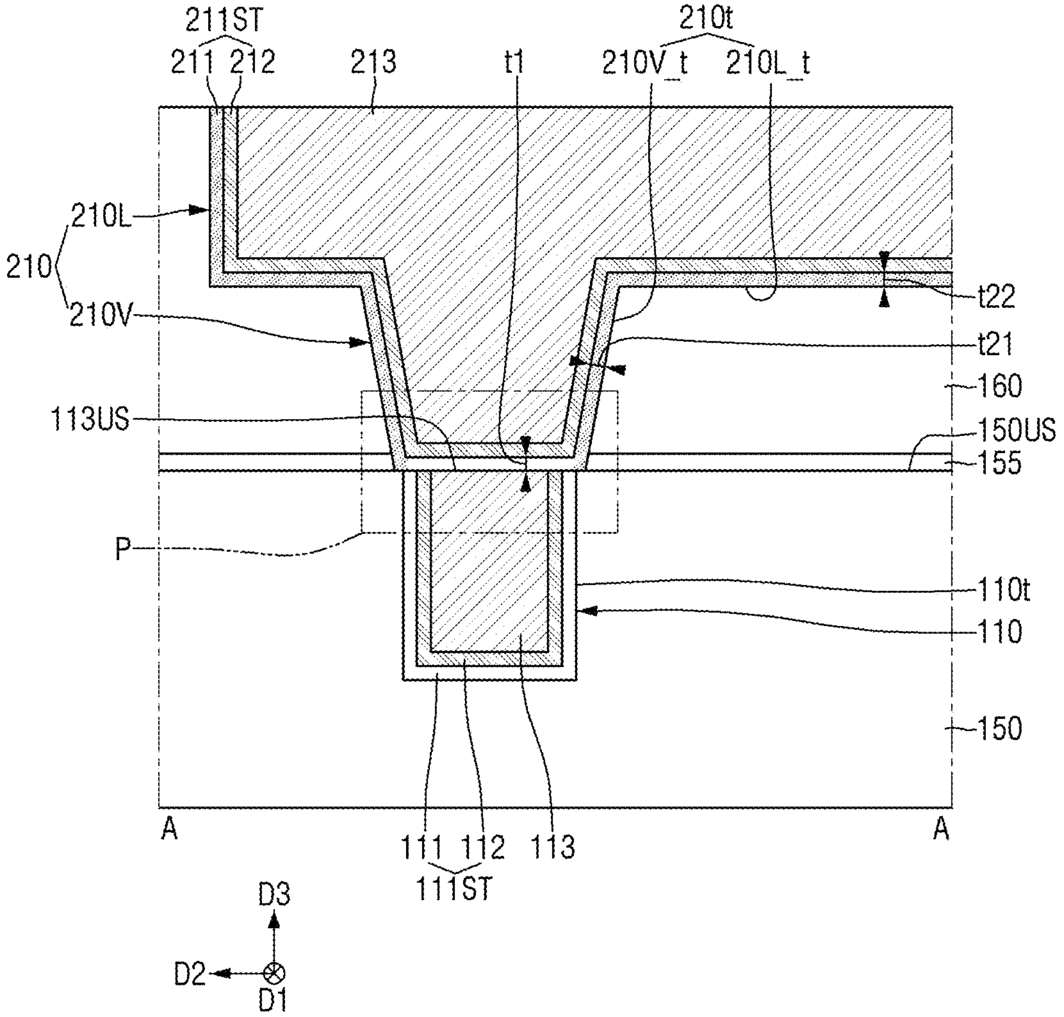
FIGS. 9 to 12 are views for describing a semiconductor device according to some example embodiments.
Figure 10:
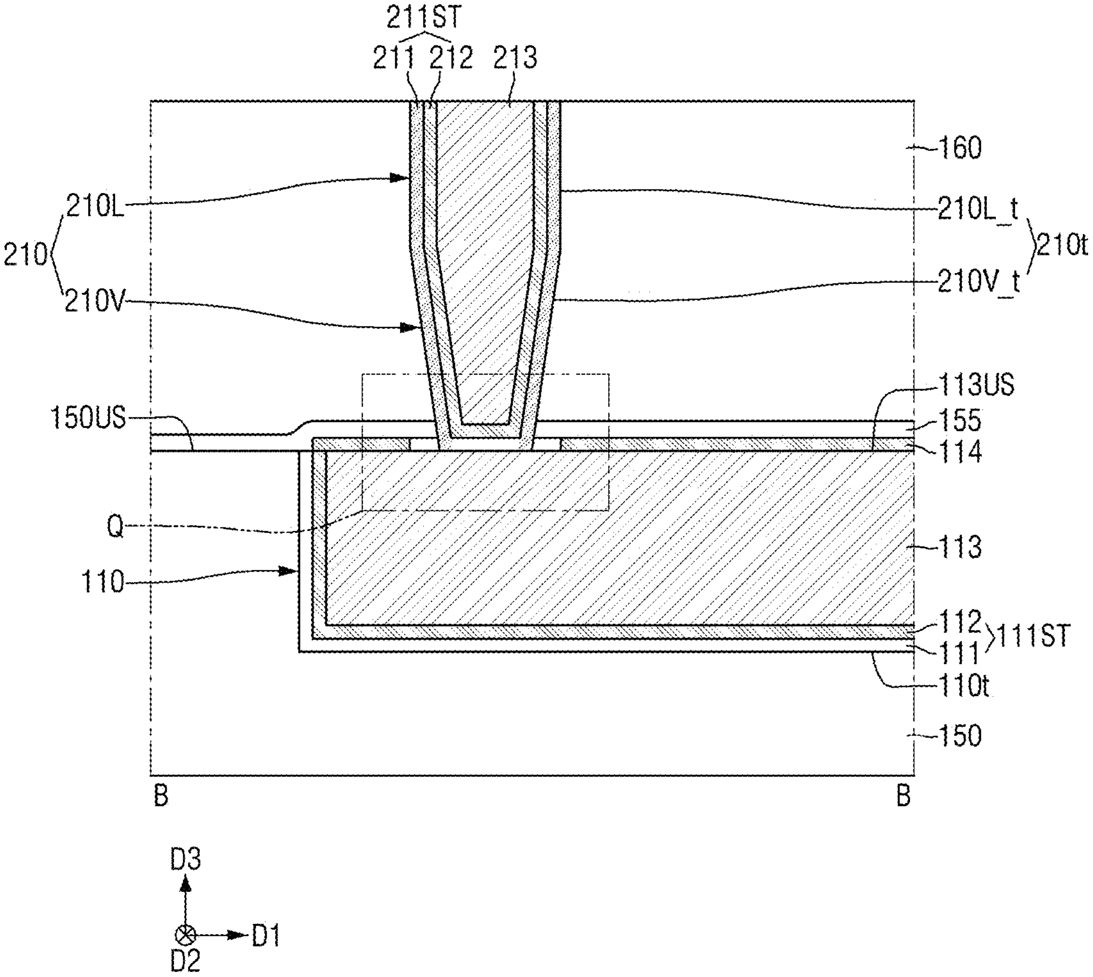
Figure 11:
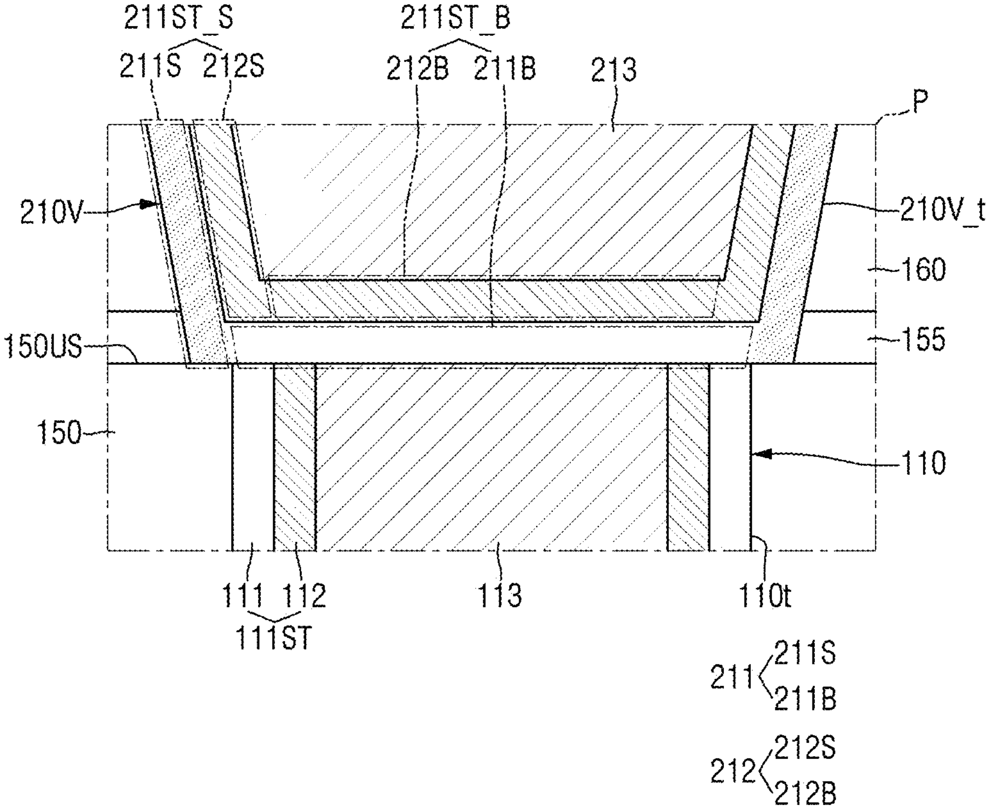
Figure 12:
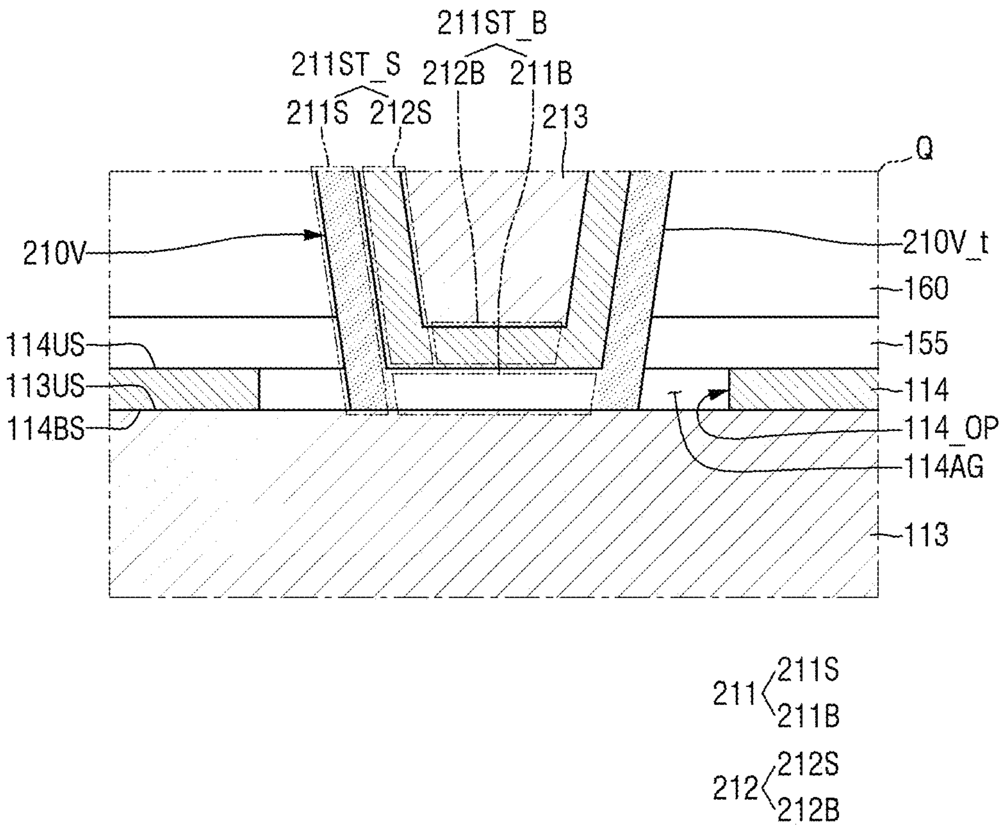

For reference, FIG. 11 is an enlarged view of part P of FIG. 9. FIG. 12 is an enlarged view of part Q of FIG. 10.

Referring to FIGS. 9 to 12, in the semiconductor device according to some example embodiments, the upper barrier film 211 may extend along the sidewalls and the bottom surface of the upper wiring trench 210*t*.

The upper barrier film 211 may extend along the sidewalls and the bottom surface of the upper wiring line trench 210L_t and the sidewalls and the bottom surface of the upper via trench 210V_t.

The upper barrier film 211 may include a sidewall portion 211S and a bottom portion 211B. The sidewall portion 211S of the upper barrier film extends along the sidewalls and the bottom surface of the upper wiring line trench 210L_t and the sidewalls of the upper via trench 210V_t. The bottom portion 211B of the upper barrier film may extend along the bottom surface of the upper wiring trench 210V_t.

The sidewall portion 211B of the upper barrier film may be in contact with the upper surface 113US of the lower filling film defining the bottom surface of the upper via trench 210V_t. Since the upper barrier film 211 is disposed between the upper liner 212 and the lower filling film 113, the sidewall portion 212S of the upper liner may not be in contact with the upper surface 113US of the lower filling film.

For example, thicknesses t21 and t22 of the sidewall portion 211S of the upper barrier film may be equal to a thickness t1 of the bottom portion 211B of the upper barrier film. The thickness t21 of the sidewall portion 211S of the upper barrier film on the sidewall of the upper via trench 210V_t may be equal to the thickness t1 of the sidewall portion 211S of the upper barrier film on the bottom surface of the upper via trench 210V_t. The thickness t21 of the sidewall portion 211S of the upper barrier film on the sidewall of the upper via trench 210V_t may be equal to the thickness t22 of the sidewall portion 211S of the upper barrier film on the bottom surface of the upper wiring line trench 210L_t.

In the semiconductor device according to some example embodiments, the upper barrier film 211 may include tantalum nitride (TaN) doped with ruthenium (Ru) and tantalum nitride (TaN). The sidewall portion 211S of the upper barrier film may be formed of doped tantalum nitride (TaN). The bottom portion 211B of the upper barrier film may be formed of tantalum nitride (TaN). The bottom portion 211B of the upper barrier film may not include tantalum nitride (TaN) doped with ruthenium (Ru).

The bottom portion 211ST_B of the upper barrier structure may include the bottom portion 212B of the upper liner and the bottom portion 211B of the upper barrier film. The bottom portion 211ST_B of the upper barrier structure may not include doped tantalum nitride (TaN).

Figure 13:
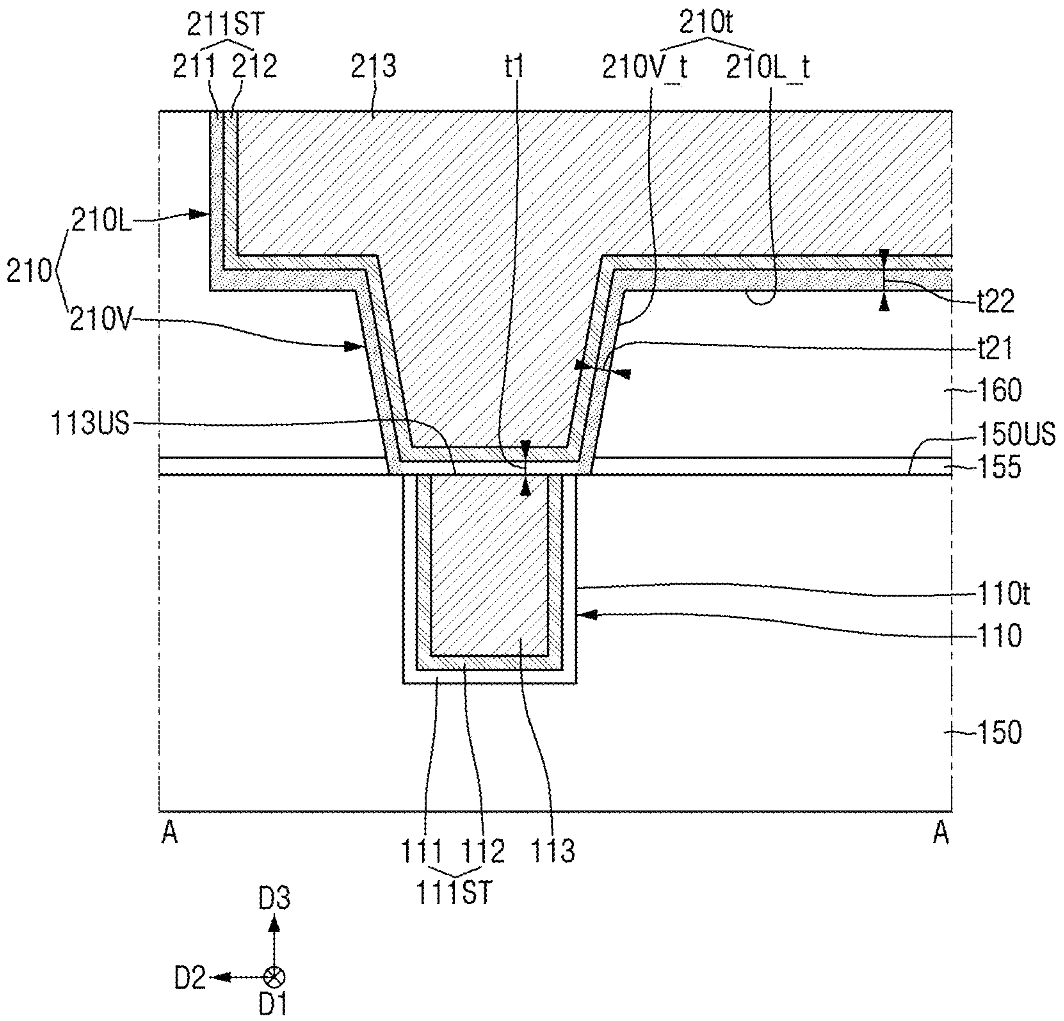
FIG. 13 is a view for describing a semiconductor device according to some example embodiments.

FIG. 13 is a view for describing a semiconductor device according to some example embodiments. For convenience of explanation, points different from those described with reference to FIGS. 9 to 12 will be mainly described.

Referring to FIG. 13, in the semiconductor device according to some example embodiments, the thickness t22 of the sidewall portion 211S of the upper barrier film on the bottom surface of the upper wiring line trench 210L_t may be greater than the thickness t21 of the sidewall portion 211S of the upper barrier film on the sidewall of the upper via trench 210V_t.

The thickness t22 of the sidewall portion 211S of the upper barrier film on the bottom surface of the upper wiring line trench 210L_t may be greater than the thickness t1 of the sidewall portion 211S of the upper barrier film on the bottom surface of the upper via trench 210V_t. The thickness t21 of the sidewall portion 211S of the upper barrier film on the sidewall of the upper via trench 210V_t may be equal to the thickness t1 of the sidewall portion 211S of the upper barrier film on the bottom surface of the upper via trench 210V_t.

The thicknesses t21 and t22 of the sidewall portion 211S of the upper barrier film may be equal to or greater than the thickness t1 of the bottom portion 211B of the upper barrier film.

FIGS. 14 to 17 are views for describing a semiconductor device according to some example embodiments. For convenience of explanation, points different from those described with reference to FIGS. 1 to 5 will be mainly described.

Figure 14:
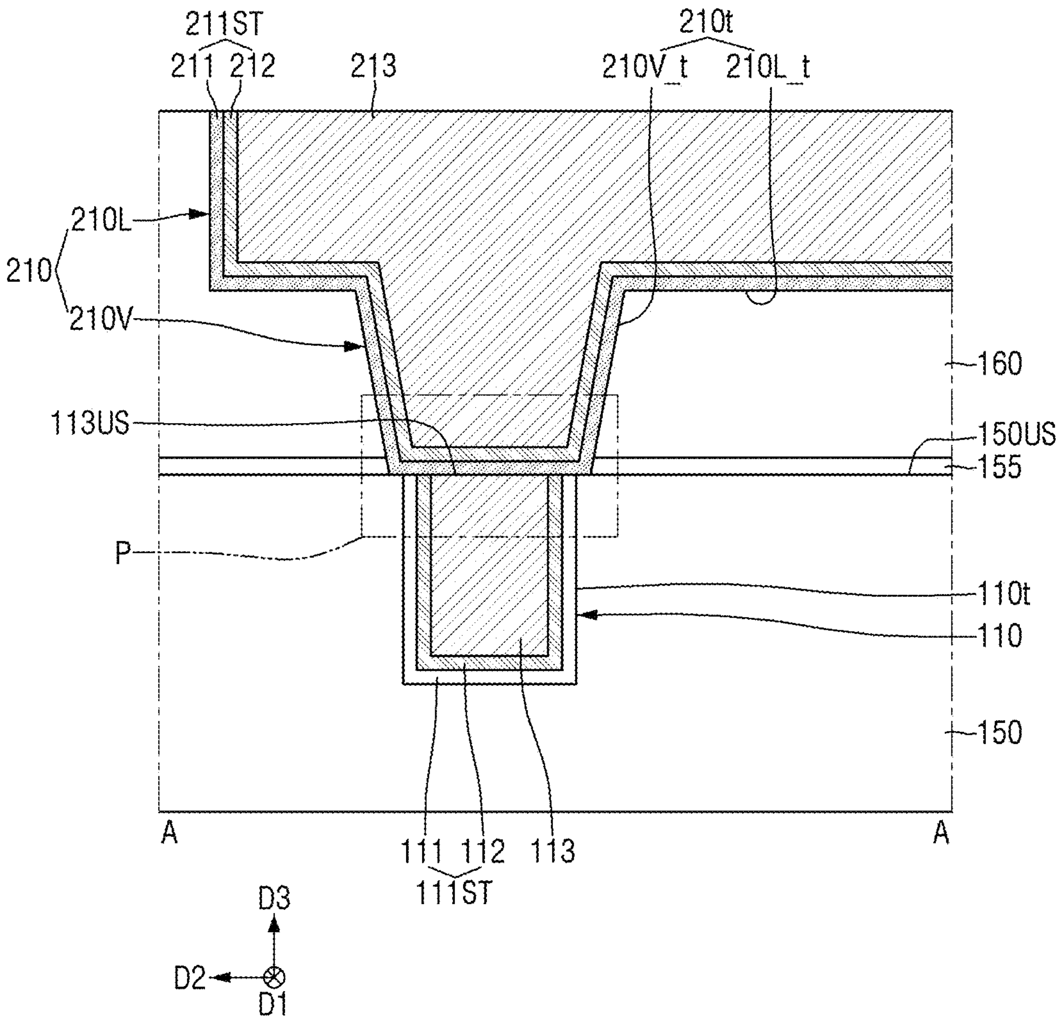
FIGS. 14 to 17 are views for describing a semiconductor device according to some example embodiments.
Figure 15:
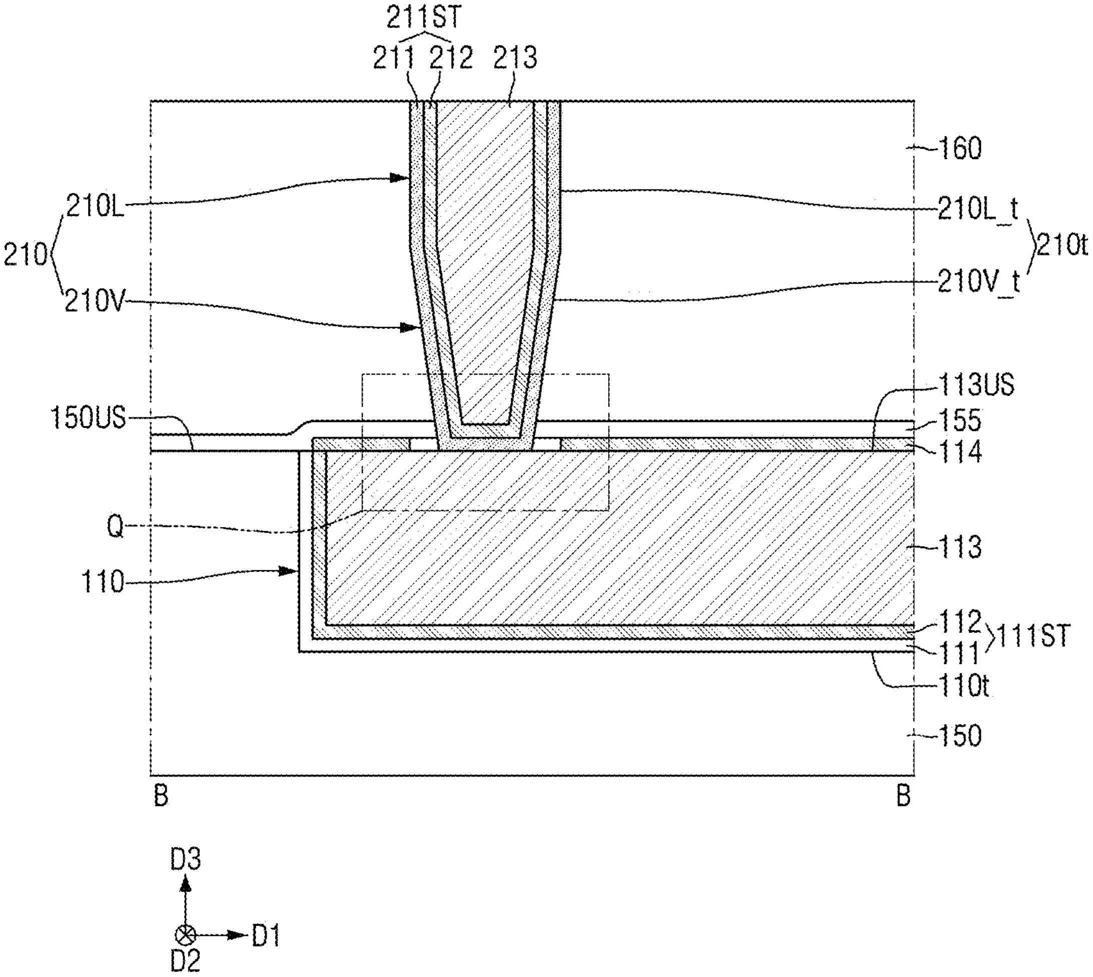
Figure 16:
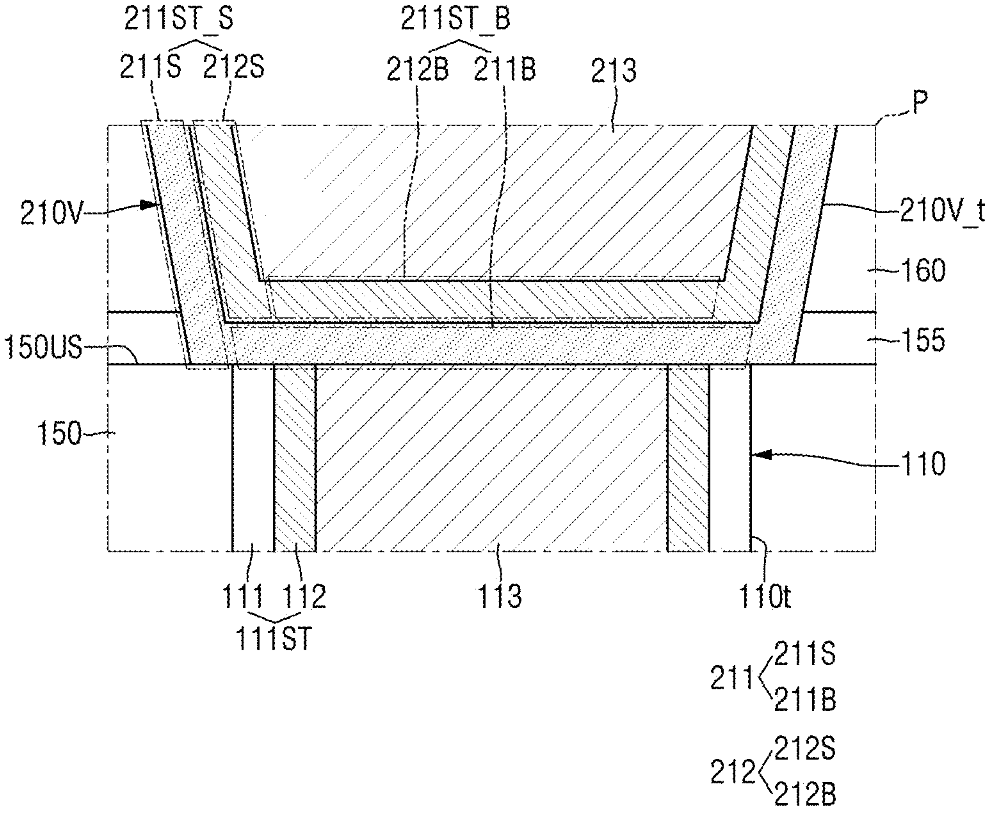
Figure 17:
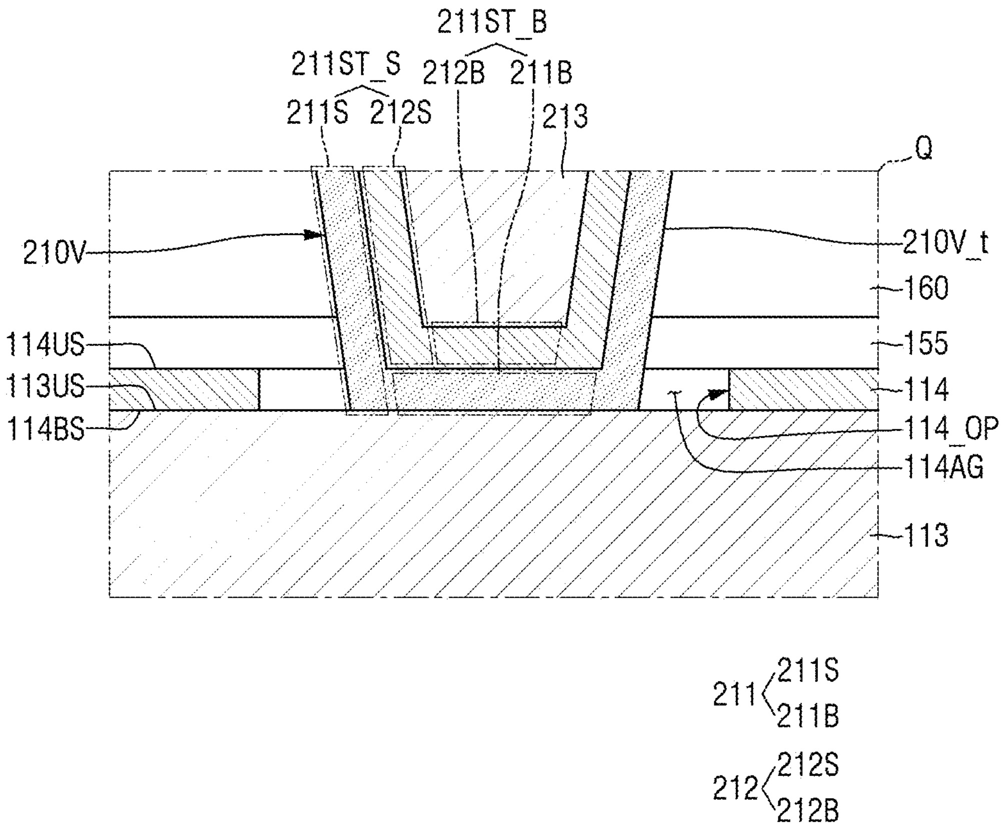

For reference, FIG. 16 is an enlarged view of part P of FIG. 14. FIG. 17 is an enlarged view of part Q of FIG. 15.

Referring to FIGS. 14 to 17, the upper barrier film 211 may include a sidewall portion 211S extending along the sidewalls of the upper wiring trench 210*t* and a bottom portion 211B extending along the bottom surface of the upper wiring trench 210*t*.

The bottom portion 211B of the upper barrier film 211 may be in contact with the upper surface 113US of the lower filling film. The upper liner 212 may not be in contact with the upper surface 113US of the lower filling film.

The upper barrier film 211 may include tantalum nitride (TaN) doped with ruthenium (Ru). The sidewall portion 211S of the upper barrier film may be formed of doped tantalum nitride (TaN). The bottom portion 211B of the upper barrier film may be formed of tantalum nitride (TaN) doped with ruthenium (Ru).

The bottom portion 211ST_B of the upper barrier structure may include the bottom portion 212B of the upper liner and the bottom portion 211B of the upper barrier film. The bottom portion 211ST_B of the upper barrier structure may include doped tantalum nitride (TaN).

As an example, the upper liner 212 may be formed of cobalt (Co). As another example, the sidewall portion 212S of the upper liner may be formed of cobalt (Co) doped with ruthenium (Ru). The bottom portion 212B of the upper liner may be formed of cobalt (Co). As still another example, the upper liner 212 may be formed of cobalt (Co) doped with ruthenium (Ru).

Figure 18:
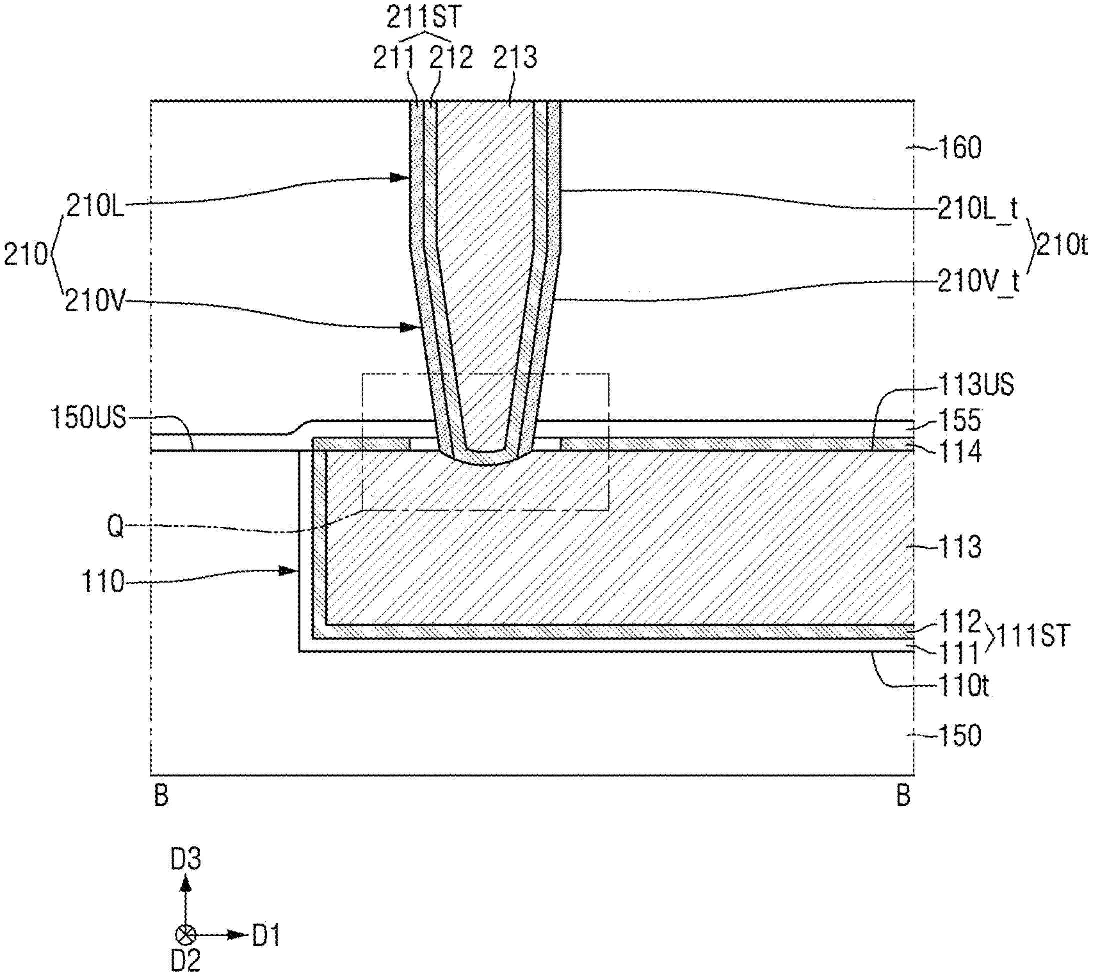
FIGS. 18 and 19 are views for describing a semiconductor device according to some example embodiments.
Figure 19:
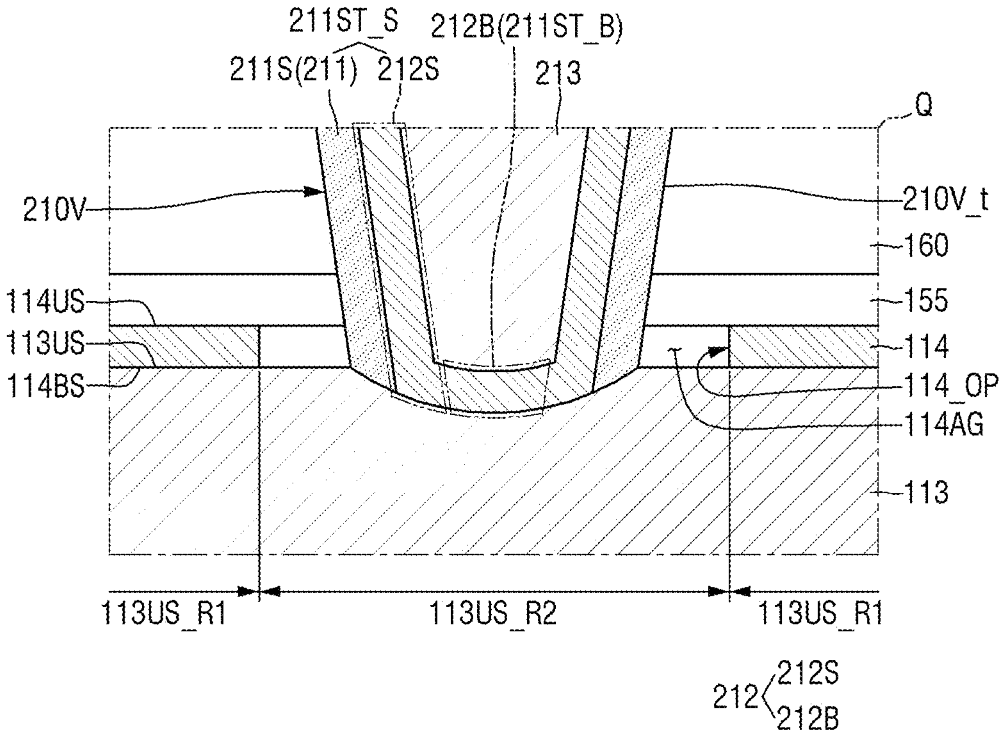
Figure 20:
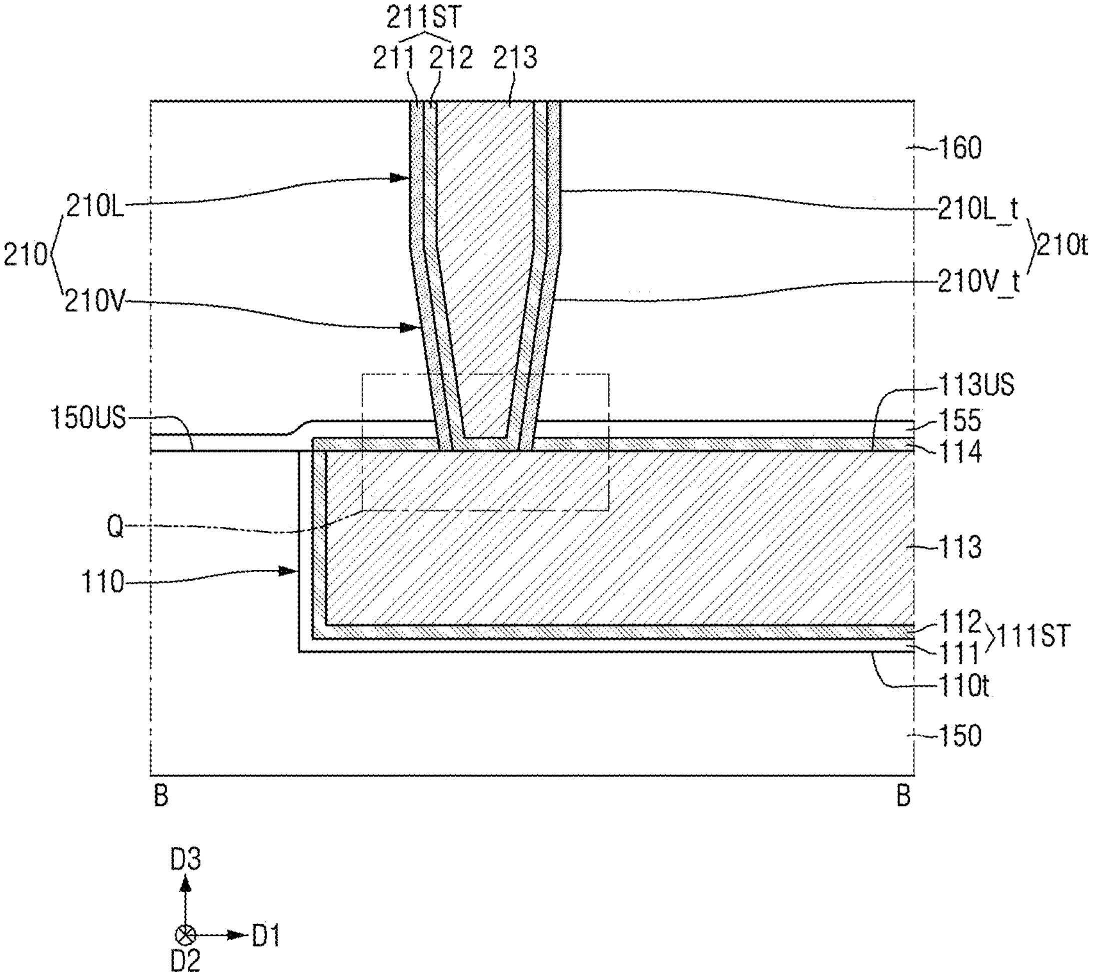
FIGS. 20 and 21 are views for describing a semiconductor device according to some example embodiments.
Figure 21:
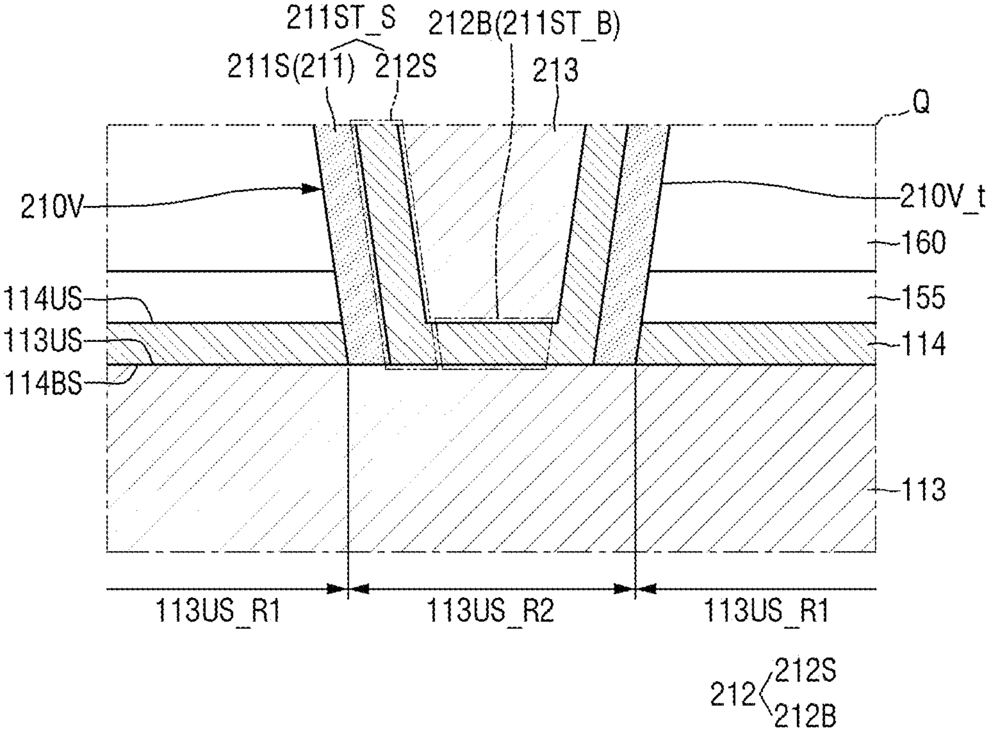

FIGS. 18 and 19 are views for describing a semiconductor device according to some example embodiments. FIGS. 20 and 21 are views for describing a semiconductor device according to some example embodiments. For convenience of explanation, points different from those described with reference to FIGS. 1 to 5 will be mainly described.

For reference, FIG. 19 is an enlarged view of part Q of FIG. 18. FIG. 21 is an enlarged view of part Q of FIG. 20.

Referring to FIGS. 18 and 19, in the semiconductor device according to some example embodiments, the upper surface 113US of the lower filling film in contact with the upper wiring structure 210 may have a concave curved shape.

At least a portion of the second region 113US_R2 of the upper surface of the lower filling film may have a concave curved shape. Unlike as illustrated, an entirety of the second region 113US_R2 of the upper surface of the lower filling film may have a concave curved shape.

Referring to FIGS. 20 and 21, in the semiconductor device according to some example embodiments, the lower capping film 114 may not be undercut to the lower portion of the first etch stop film 155.

The upper barrier film 211 may be in contact with the lower capping film 114. The sidewall portion 211ST_S of the upper barrier structure may be in contact with the lower capping film 114 defining the capping opening 114_OP.

Figure 22:
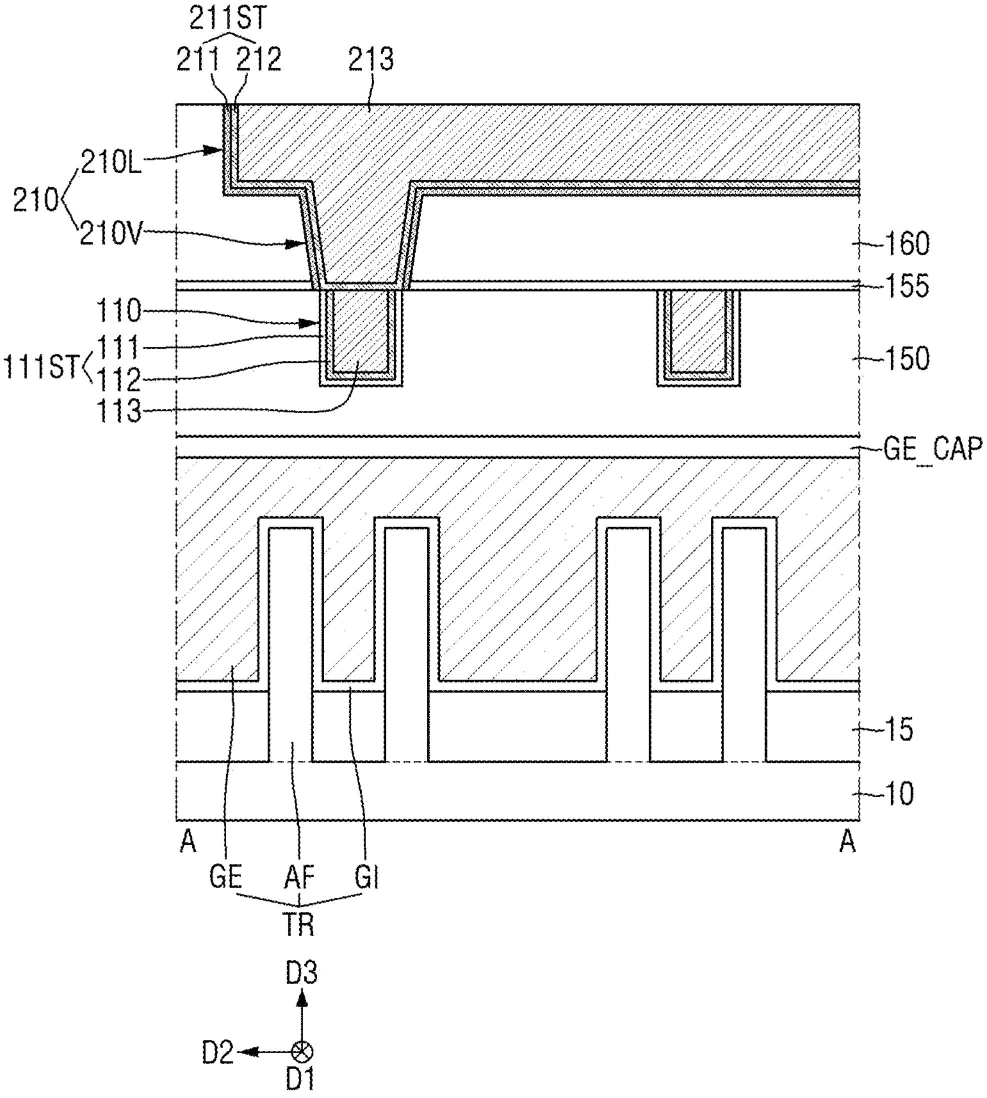
FIG. 22 is a view for describing a semiconductor device according to some example embodiments.

FIG. 22 is a view for describing a semiconductor device according to some example embodiments. For convenience of explanation, points different from those described with reference to FIGS. 1 to 5 will be mainly described.

For reference, FIG. 22 illustrates a semiconductor device cut along a first gate electrode GE by example.

It is illustrated in FIG. 22 that a fin-shaped pattern AF extends in the first direction D1 and the first gate electrode GE extends in the second direction D2, but the present disclosure is not limited thereto.

Referring to FIG. 22, the semiconductor device according to some example embodiments may include a transistor TR disposed between a substrate 10 and the lower wiring structure 110.

The substrate 10 may be a silicon substrate or silicon-on-insulator (SOI). Unlike this, the substrate 10 may include silicon germanium, silicon germanium on insulator (SGOI), indium antimonide, lead tellurium compound, indium arsenide, indium phosphide, gallium arsenide, or gallium antimonide, but is not limited thereto.

The transistor TR may include a fin-shaped pattern AF, a first gate electrode GE on the fin-shaped pattern AF, and a first gate insulating film GI between the fin-shaped pattern AF and the first gate electrode GE.

Although not illustrated, the transistor TR may include source/drain patterns disposed on both sides of the first gate electrode GE.

The fin-shaped pattern AF may protrude from the substrate 10. The fin-shaped pattern AF may extend to be elongated in the first direction D1. The fin-shaped pattern AF may also be a portion of the substrate 10, and may include an epitaxial layer grown from the substrate 10. The fin-shaped pattern AF may include, for example, silicon or germanium, which is an elemental semiconductor material. In addition, the fin-shaped pattern AF may include a compound semiconductor, for example, a group IV-IV compound semiconductor or a group III-V compound semiconductor.

The group IV-IV compound semiconductor may be, for example, a binary compound or a ternary compound including at least two or more of carbon (C), silicon (Si), germanium (Ge), and tin (Sn), or a compound obtained by doping carbon (C), silicon (Si), germanium (Ge), and tin (Sn) with a group IV element. The III-V compound semiconductor may be, for example, one of a binary compound, a ternary compound, or a quaternary compound formed by combining at least one of aluminum (Al), gallium (Ga), and indium (In), which are group III elements, and one of phosphorus (P), arsenic (As), and antimony (Sb), which are group V elements.

A field insulating film 15 may be disposed on the substrate 10. The field insulating film 15 may be formed on a portion of a sidewall of the fin-shaped pattern AF. The fin-shaped pattern AF may protrude upwardly compared to an upper surface of the field insulating film 15. The field insulating film 15 may include, for example, an oxide film, a nitride film, an oxynitride film, or a combination thereof.

The first gate electrode GE may be disposed on the fin-shaped pattern AF. The first gate electrode GE may extend in the second direction D2. The first gate electrode GE may intersect the fin-shaped pattern AF.

The first gate electrode GE may include, for example, at least one of a metal, conductive metal nitride, conductive metal carbonitride, conductive metal carbide, metal silicide, a doped semiconductor material, conductive metal oxynitride, and conductive metal oxide.

The first gate insulating film GI may be disposed between the first gate electrode GE and the fin-shaped pattern AF and between the first gate electrode GE and the field insulating film 15. The first gate insulating film GI may include, for example, silicon oxide, silicon oxynitride, silicon nitride, or a high-k material having a dielectric constant greater than that of silicon oxide. The high-k material may include, for example, at least one of boron nitride, metal oxide, and metal silicon oxide.

The semiconductor device according to some example embodiments may include a negative capacitance (NC) FET using a negative capacitor. For example, the first gate insulating film GI may include a ferroelectric material film having ferroelectric characteristics and a paraelectric material film having paraelectric characteristics.

The ferroelectric material film may have a negative capacitance, and the paraelectric material film may have a positive capacitance. For example, when two or more capacitors are connected in series with each other and the capacitance of each capacitor has a positive value, a total capacitance decreases as compared with a capacitance of each individual capacitor. On the other hand, when at least one of the capacitances of two or more capacitors connected in series with each other has a negative value, the total capacitance may be greater than an absolute value of each individual capacitance while having a positive value.

When the ferroelectric material film having the negative capacitance and the paraelectric material film having the positive capacitance are connected in series with each other, a total capacitance value of the ferroelectric material film and the paraelectric material film connected in series with each other may increase. A transistor including the ferroelectric material film may have a subthreshold swing (SS) less than 60 mV/decade at room temperature by using the increase in the total capacitance value.

The ferroelectric material film may have the ferroelectric characteristics. The ferroelectric material film may include, for example, at least one of hafnium oxide, hafnium zirconium oxide, barium strontium titanium oxide, barium titanium oxide, and lead zirconium titanium oxide. Here, as an example, the hafnium zirconium oxide may be a material obtained by doping hafnium oxide with zirconium (Zr). As another example, the hafnium zirconium oxide may also be a compound of hafnium (Hf), zirconium (Zr), and oxygen (O).

The ferroelectric material film may further include a doped dopant. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn). A type of dopant included in the ferroelectric material film may vary depending on a type of ferroelectric material included in the ferroelectric material film.

When the ferroelectric material film includes hafnium oxide, the dopant included in the ferroelectric material film may include, for example, at least one of gadolinium (Gd), silicon (Si), zirconium (Zr), aluminum (Al), and yttrium (Y).

When the dopant is aluminum (Al), the ferroelectric material film may include 3 to 8 atomic % (at %) of aluminum. Here, a ratio of the dopant may be a ratio of aluminum to the sum of hafnium and aluminum.

When the dopant is silicon (Si), the ferroelectric material film may include 2 to 10 at % of silicon. When the dopant is yttrium (Y), the ferroelectric material film may include 2 to 10 at % of yttrium. When the dopant is gadolinium (Gd), the ferroelectric material film may contain 1 to 7 at % of gadolinium. When the dopant is zirconium (Zr), the ferroelectric material film may include 50 to 80 at % of zirconium.

The paraelectric material film may have the paraelectric characteristics. The paraelectric material film may include, for example, at least one of silicon oxide and metal oxide having a high dielectric constant. The metal oxide included in the paraelectric material film may include, for example, at least one of hafnium oxide, zirconium oxide, and aluminum oxide, but is not limited thereto.

The ferroelectric material film and the paraelectric material film may include the same material. The ferroelectric material film may have the ferroelectric characteristics, but the paraelectric material film may not have the ferroelectric characteristics. For example, when the ferroelectric material film and the paraelectric material film include the hafnium oxide, a crystal structure of the hafnium oxide included in the ferroelectric material film is different from a crystal structure of the hafnium oxide included in the paraelectric material film.

The ferroelectric material film may have a thickness having the ferroelectric characteristics. The thickness of the ferroelectric material film may be, for example, 0.5 to 10 nm, but is not limited thereto. Since a critical thickness representing the ferroelectric characteristics may vary for each ferroelectric material, the thickness of the ferroelectric material film may vary depending on the ferroelectric material.

As an example, the first gate insulating film GI may include one ferroelectric material film. As another example, the first gate insulating film GI may include a plurality of ferroelectric material films spaced apart from each other. The first gate insulating film GI may have a stacked film structure in which a plurality of ferroelectric material films and a plurality of paraelectric material films are alternately stacked.

A gate capping pattern GE_CAP may be disposed on the first gate electrode GE. Conductive lower wirings 110 and 120 may be disposed on the first gate electrode GE. The conductive lower wirings 110 and 120 are illustrated as being not connected to the first gate electrode GE, but are not limited thereto. One of the conductive lower wirings 110 and 120 may be connected to the first gate electrode GE.

Figure 23:
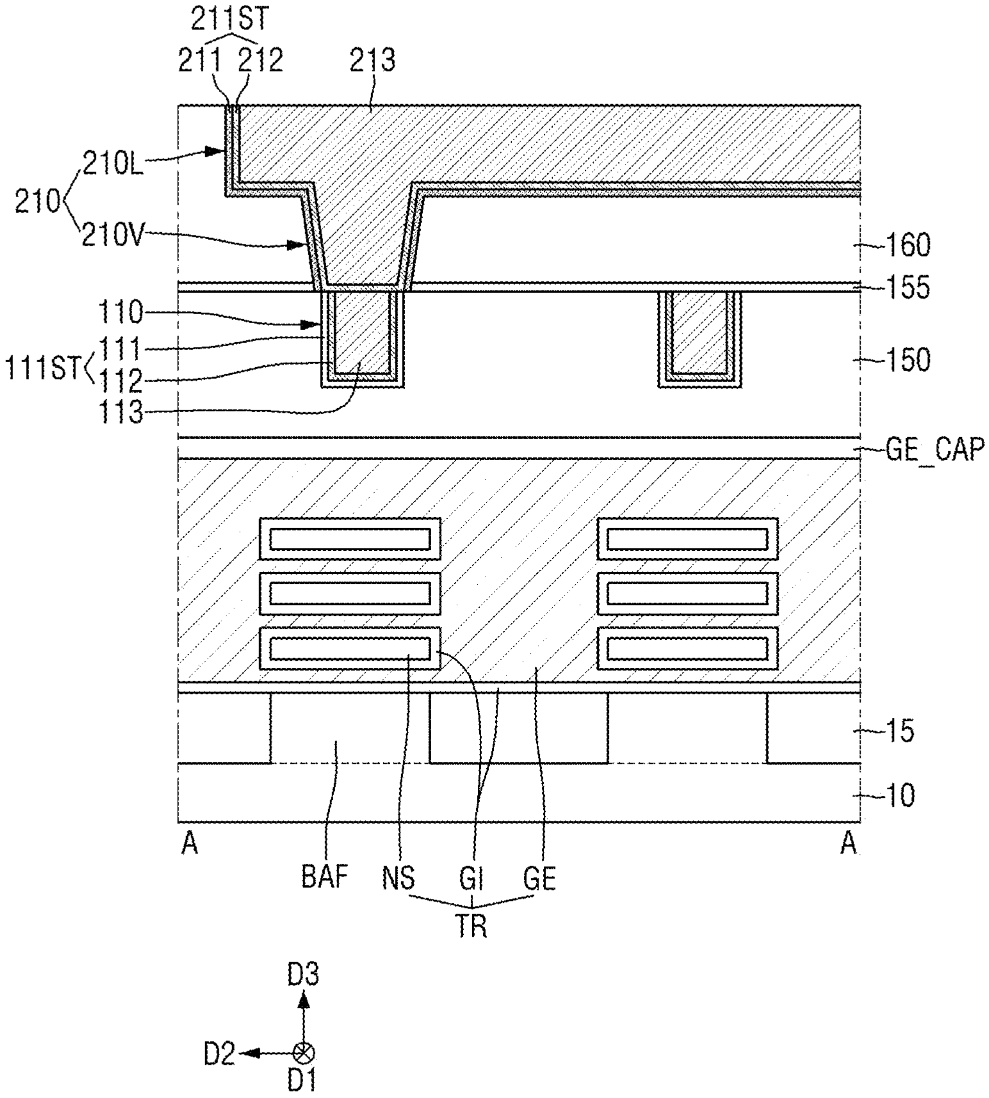
FIG. 23 is a view for describing a semiconductor device according to some example embodiments.

FIG. 23 is a view for describing a semiconductor device according to some example embodiments. For convenience of explanation, portions different from those described with reference to FIG. 22 will be mainly described.

Referring to FIG. 23, in the semiconductor device according to some example embodiments, the transistor TR may include a nanosheet NS, a first gate electrode GE surrounding the nanosheet NS, and a first gate insulating film GI between the nanosheet NS and the first gate electrode GE.

The nanosheet NS may be disposed on a lower fin-shaped pattern BAF. The nanosheet NS may be spaced apart from the lower fin-shaped pattern BAF in the third direction D3. The transistor TR is illustrated as including three nanosheets NS spaced apart from each other in the third direction D3, but is not limited thereto. The number of nanosheets NS disposed on the lower fin-shaped pattern BAF in the third direction D3 may also be greater than three or less than three.

Each of the lower fin-shaped pattern BAF and the nanosheet NS may include, for example, silicon or germanium, which is an elemental semiconductor material. Each of the lower fin-shaped pattern BAF and the nanosheet NS may include a compound semiconductor, for example, a group IV-IV compound semiconductor or a group III-V compound semiconductor. The lower fin-shaped pattern BAF and the nanosheet NS may also include the same material or different materials.

Figure 24:
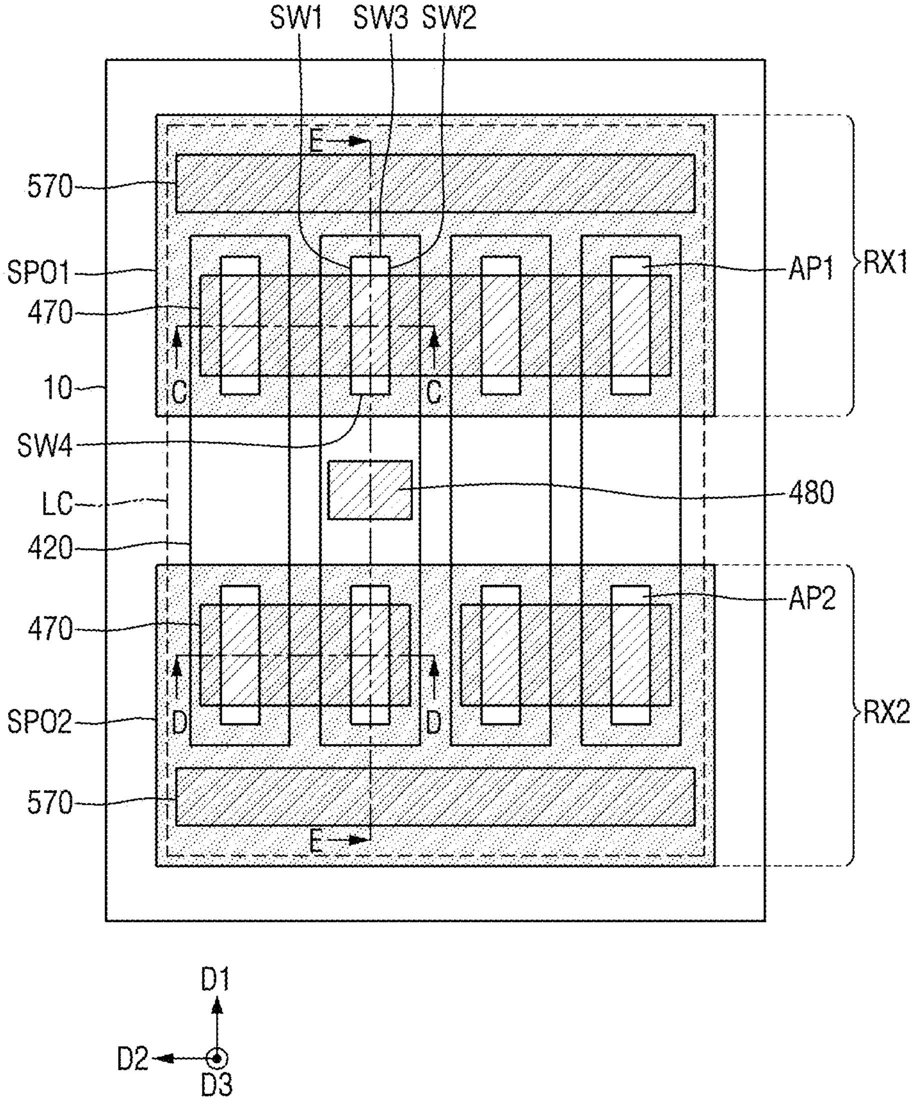
FIGS. 24 to 26 are views for describing a semiconductor device according to some example embodiments.
Figure 25:
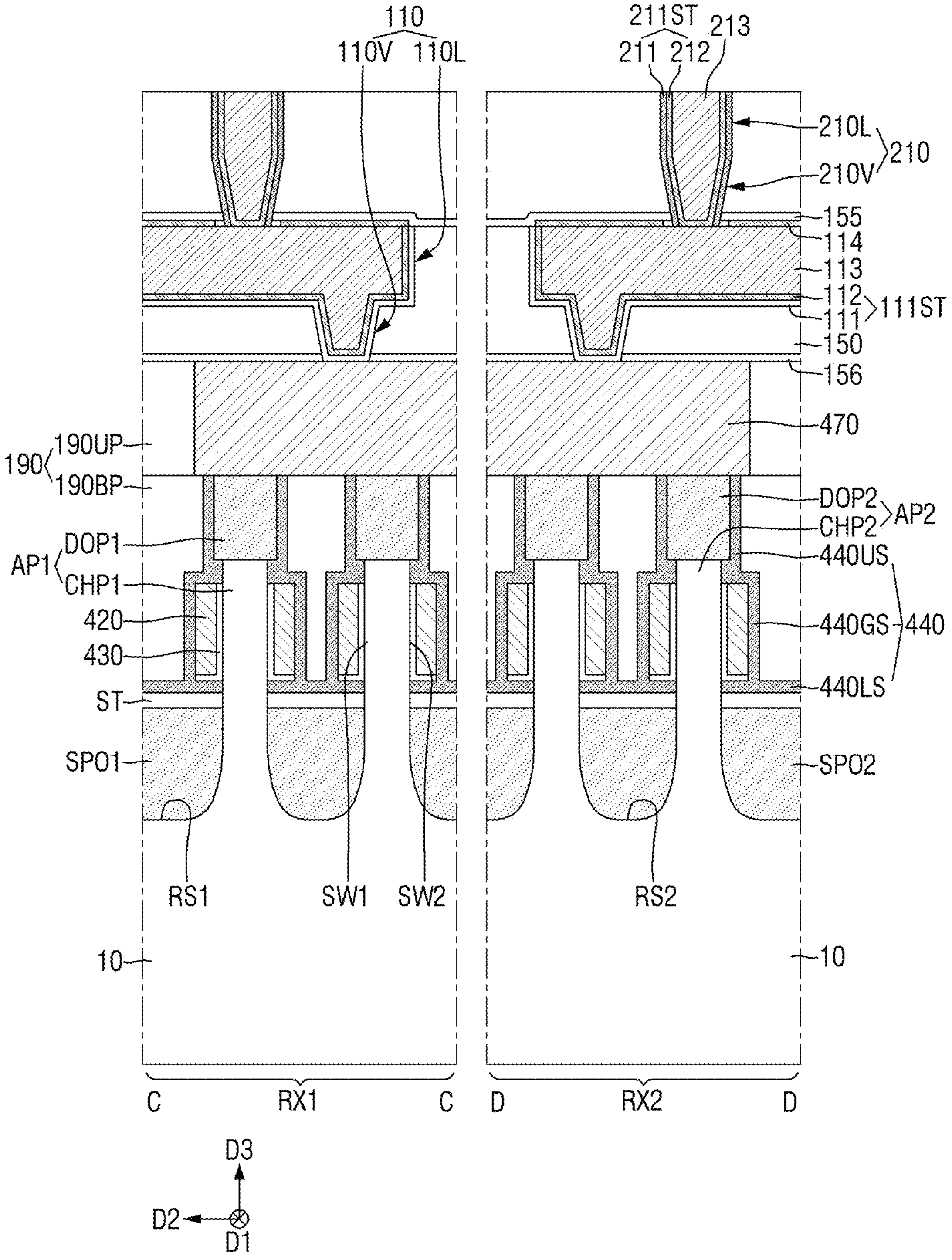
Figure 26:
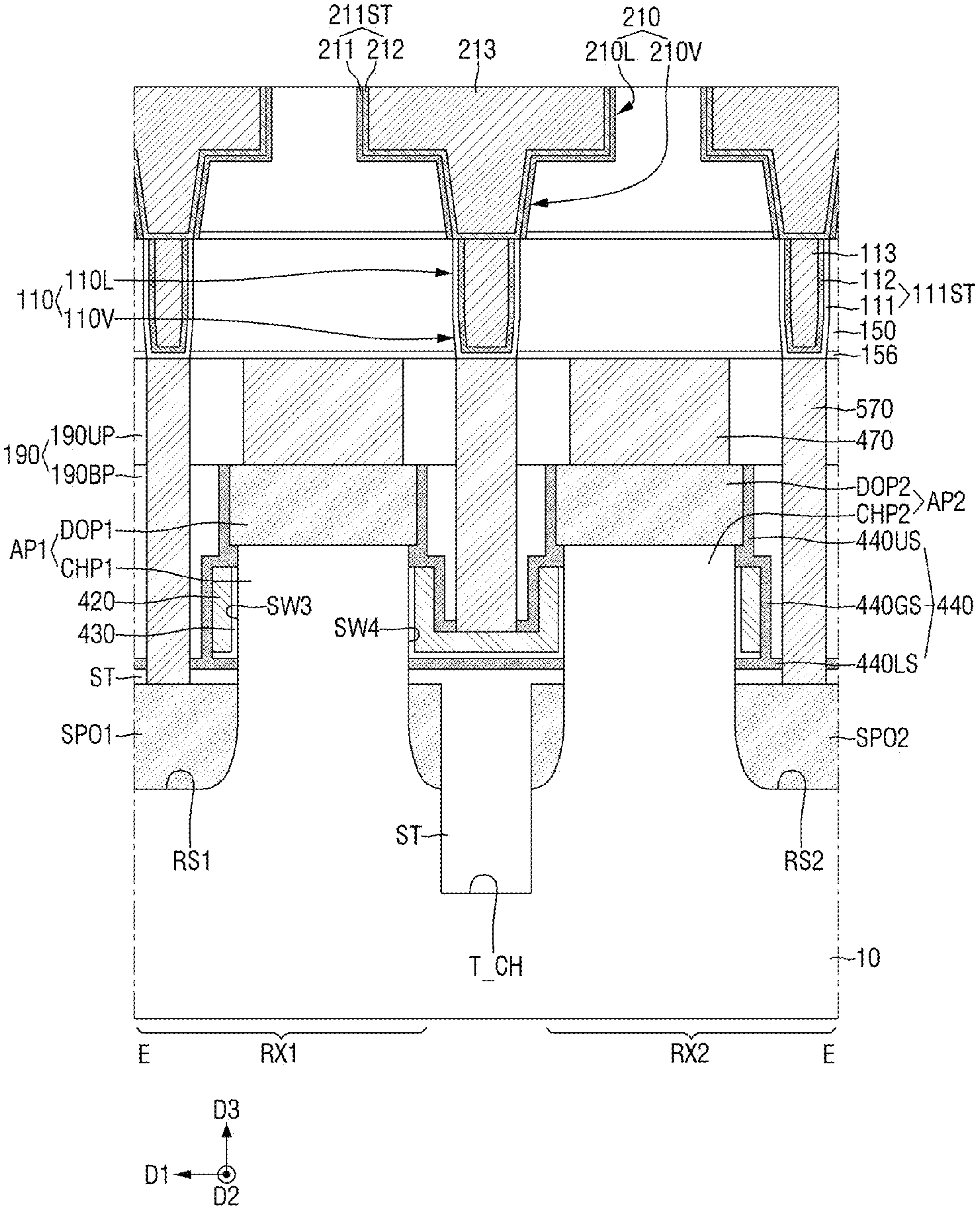

FIGS. 24 to 26 are views for describing a semiconductor device according to some example embodiments. For reference, FIG. 24 is a plan view for describing a semiconductor device according to some example embodiments. FIG. 25 is a cross-sectional view taken along lines C-C and D-D of FIG. 24. FIG. 26 is a cross-sectional view taken along line E-E of FIG. 24.

Referring to FIGS. 24 to 26, a logic cell LC may be provided on the substrate 10. The logic cell LC may refer to a logic element (e.g., an inverter, a flip-flop, etc.) that performs a specific function. The logic cell LC may include vertical FETs constituting the logic element and wirings connecting the vertical FETs to each other.

The logic cell LC on the substrate 10 may include a first active region RX1 and a second active region RX2. For example, the first active region RX1 may be a PMOSFET region, and the second active region RX2 may be an NMOSFET region. The first and second active regions RX1 and RX2 may be defined by a trench T_CH formed on an upper portion of the substrate 10. The first and second active regions RX1 and RX2 may be spaced apart from each other in the first direction D1.

A first lower epitaxial pattern SPO1 may be provided on the first active region RX1, and a second lower epitaxial pattern SPO2 may be provided on the second active region RX2. In plan view, the first lower epitaxial pattern SPO1 may overlap the first active region RX1, and the second lower epitaxial pattern SPO2 may overlap the second active region RX2. The first and second lower epitaxial patterns SPO1 and SPO2 may be epitaxial patterns formed by a selective epitaxial growth process. The first lower epitaxial pattern SPO1 may be provided in a first recessed region RS1 of the substrate 10, and the second lower epitaxial pattern SPO2 may be provided in a second recess region RS2 of the substrate 10.

First active patterns AP1 may be provided on the first active region RX1, and second active patterns AP2 may be provided on the second active region RX2. Each of the first and second active patterns AP1 and AP2 may have a fin shape that vertically protrudes. In plan view, each of the first and second active patterns AP1 and AP2 may have a bar shape extending in the first direction D1. The first active patterns AP1 may be arranged along the second direction D2 and the second active patterns AP2 may be arranged along the second direction D2.

Each of the first active patterns AP1 may include a first channel pattern CHP1 vertically protruding from the first lower epitaxial pattern SPO1 and a first upper epitaxial pattern DOP1 on the first channel pattern CHP1. Each of the second active patterns AP2 may include a second channel pattern CHP2 vertically protruding from the second lower epitaxial pattern SPO2 and a second upper epitaxial pattern DOP2 on the second channel pattern CHP2.

An element separation film ST may be provided on the substrate 10 to fill the trench T_CH. The element separation film ST may cover upper surfaces of the first and second lower epitaxial patterns SPO1 and SPO2. The first and second active patterns AP1 and AP2 may vertically protrude above the element separation film ST.

A plurality of second gate electrodes 420 extending parallel to each other in the first direction D1 may be provided on the element separation film ST. The second gate electrodes 420 may be arranged along the second direction D2. The second gate electrode 420 may surround the first channel pattern CHP1 of the first active pattern AP1 and the second channel pattern CHP2 of the second active pattern AP2. For example, the first channel pattern CHP1 of the first active pattern AP1 may have first to fourth sidewalls SW1 to SW4. The first and second sidewalls SW1 and SW2 may oppose to each other in the second direction D2, and the third and fourth sidewalls SW3 and SW4 may oppose to each other in the first direction D1. The second gate electrode 420 may be provided on the first to fourth sidewalls SW1 to SW4. In other words, the second gate electrode 420 may surround the first to fourth sidewalls SW1 to SW4.

A second gate insulating film 430 may be interposed between the second gate electrode 420 and each of the first and second channel patterns CHP1 and CHP2. The second gate insulating film 430 may cover a bottom surface of the second gate electrode 420 and an inner sidewall of the second gate electrode 420. For example, the second gate insulating film 430 may directly cover the first to fourth sidewalls SW1 to SW4 of the first active pattern AP1.

The first and second upper epitaxial patterns DOP1 and DOP2 may vertically protrude above the second gate electrode 420. An upper surface of the second gate electrode 420 may be lower than a bottom surface of each of the first and second upper epitaxial patterns DOP1 and DOP2. In other words, each of the first and second active patterns AP1 and AP2 may have a structure that vertically protrudes from the substrate 10 and penetrates through the second gate electrode 420.

The semiconductor device according to some example embodiments may include vertical transistors in which carriers move in the third direction D3. For example, when a voltage is applied to the second gate electrode 420 to "turn on" the transistor, the carriers may move from the lower epitaxial patterns SOP1 and SOP2 to the upper epitaxial patterns DOP1 and DOP2 through the channel patterns CHP1 and CHP2. In the semiconductor device according to some example embodiments, the second gate electrode 420 may completely surround the sidewalls SW1 to SW4 of the channel patterns CHP1 and CHP2. The transistor according to the present disclosure may be a three-dimensional field effect transistor (e.g., VFET) having a gate all around structure. Since the gate surrounds the channel, the semiconductor device according to some example embodiments may have excellent electrical characteristics.

A spacer 440 covering the second gate electrodes 420 and the first and second active patterns AP1 and AP2 may be provided on the element separation film ST. The spacer 440 may include a silicon nitride film or a silicon oxynitride film. The spacer 440 may include a lower spacer 440LS, an upper spacer 440US, and a gate spacer 440GS between the lower and upper spacers 440LS and 440US.

The lower spacer 440LS may directly cover an upper surface of the element separation film ST. The second gate electrodes 420 may be spaced apart from the element separation film ST in the third direction D3 by the lower spacer 440LS. The gate spacer 440GS may cover an upper surface and an outer sidewall of each of the second gate electrodes 420. The upper spacer 440US may cover the first and second upper epitaxial patterns DOP1 and DOP2. However, the upper spacer 440US may not cover upper surfaces of the first and second upper epitaxial patterns DOP1 and DOP2, and may expose the upper surfaces of the first and second upper epitaxial patterns DOP1 and DOP2.

A first portion 190BP of the lower interlayer insulating film may be provided on the spacer 440. An upper surface of the first portion 190BP of the lower interlayer insulating film may be substantially coplanar with the upper surfaces of the first and second upper epitaxial patterns DOP1 and DOP2. A second portion 190UP of the lower interlayer insulating film and the first and second interlayer insulating films 150 and 160 may be sequentially stacked on the first portion 190BP of the lower interlayer insulating film. The first portion 190BP of the lower interlayer insulating film and the second portion 190UP of the lower interlayer insulating film may be included in a lower interlayer insulating film 190. The second portion 190UP of the lower interlayer insulating film may cover the upper surfaces of the first and second upper epitaxial patterns DOP1 and DOP2.

At least one first source/drain contact 470 that penetrates through the second portion 190UP of the lower interlayer insulating film and is connected to the first and second upper epitaxial patterns DOP1 and DOP2 may be provided. At least one second source/drain contact 570 that sequentially penetrates through the lower interlayer insulating film 190, the lower spacer 440LS, and the element separation film ST and is connected to the first and second lower epitaxial patterns SPO1 and SPO2 may be provided. A gate contact 480 that sequentially penetrates through the second portion 190UP of the lower interlayer insulating film, the first portion 190BP of the lower interlayer insulating film, and the gate spacer 440GS and is connected to the second gate electrode 420 may be provided.

A second etch stop film 156 may be additionally disposed between the second portion 190UP of the lower interlayer insulating film and the first interlayer insulating film 150. The first etch stop film 155 may be disposed between the first interlayer insulating film 150 and the second interlayer insulating film 160.

The lower wiring structure 110 may be provided in the first interlayer insulating film 150. The lower wiring structure 110 may include a lower via 110V and a lower wiring line 110L. Descriptions of the lower via 110V and the lower wiring line 110L may be similar to those of the upper via 210V and the upper wiring line 210L. However, a film structure of the lower wiring structure 110 may be different from or the same as that of the upper wiring structure 210.

The lower wiring structure 110 may be connected to the first source/drain contact 470, the second source/drain contact 570, and the gate contact 480. The upper wiring structure 210 may be provided in the second interlayer insulating film 160.

Unlike as illustrated, for example, an additional wiring structure similar to the upper wiring structure 210 may be further disposed between the first source/drain contact 470 and the lower wiring structure 110.

A detailed description of the upper wiring structure 210 may be substantially the same as that described above with reference to FIGS. 1 to 21.

FIGS. 27 to 33 are intermediate operation views for describing a method of fabricating a semiconductor device according to some example embodiments.

For reference, FIGS. 27, 29 to 30, 32, and 33 are cross-sectional views taken along line A-A of FIG. 1, respectively. FIG. 28 is a cross-sectional view taken along line B-B of FIG. 1. FIG. 31 is an enlarged view of part R of FIG. 30.

Figure 27:
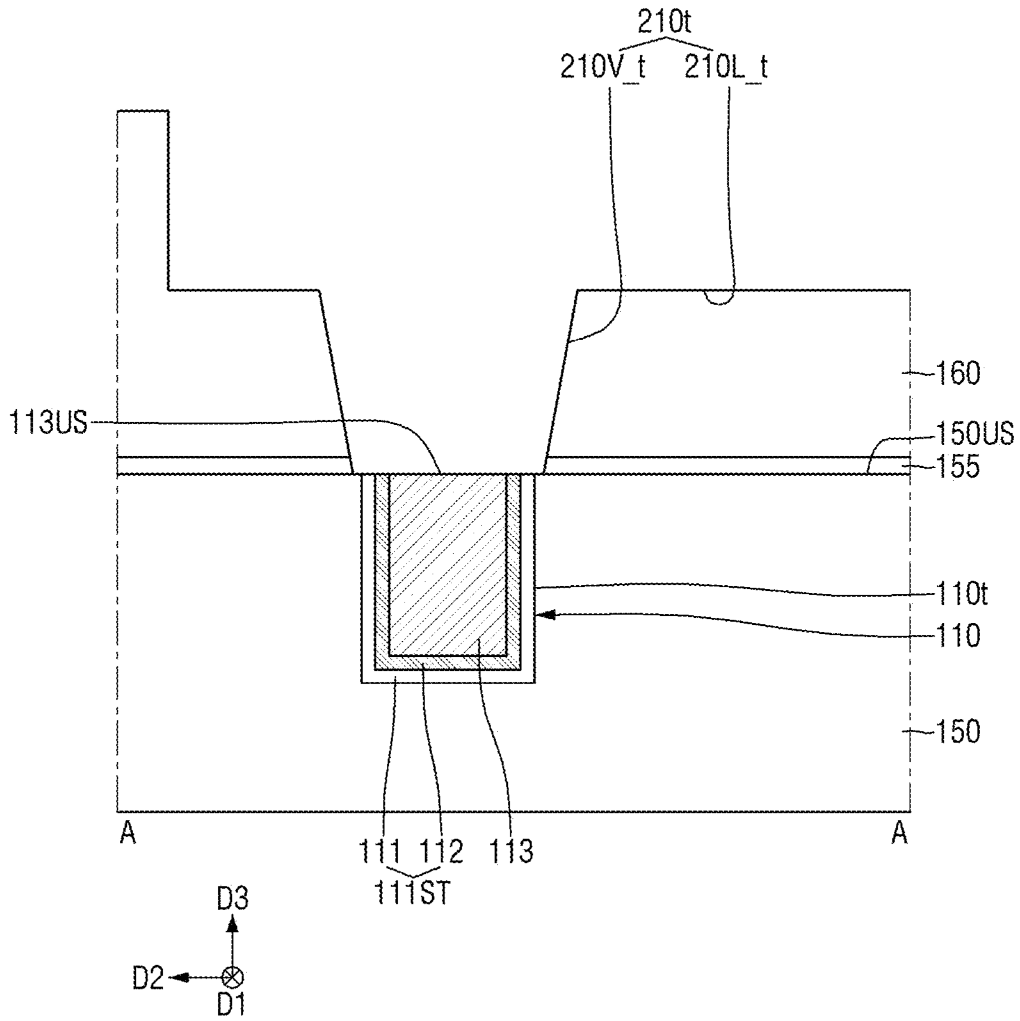
FIGS. 27 to 33 are intermediate operation views for describing a method of fabricating a semiconductor device according to some example embodiments.
Figure 28:
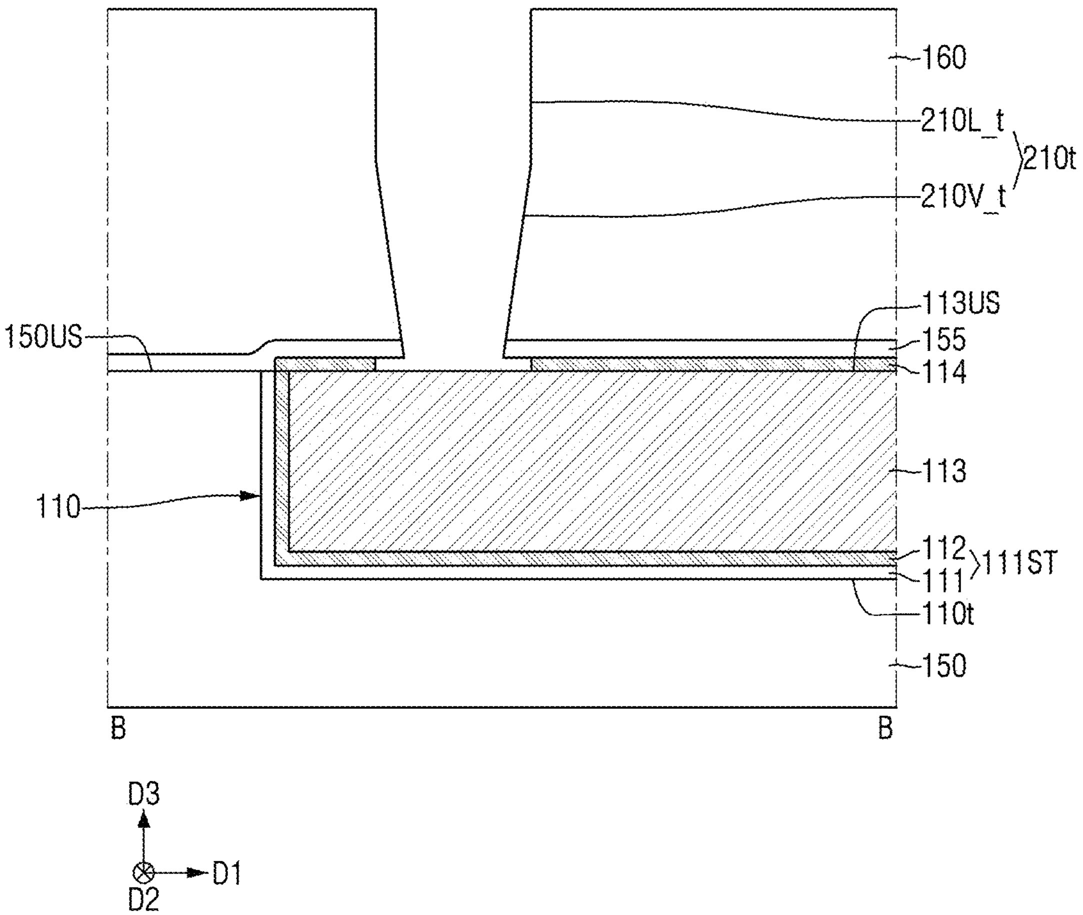

Referring to FIGS. 27 and 28, a lower wiring structure 110 is formed in a first interlayer insulating film 150.

A lower wiring trench 110*t* is formed in the first interlayer insulating film 150. The lower wiring structure 110 is formed in the lower wiring trench 110*t*. The lower wiring structure 110 may include a lower barrier film 111, a lower liner 112, a lower filling film 113, and a lower capping film 114.

Subsequently, a first etch stop film 155 may be formed on the first interlayer insulating film 150 and the lower wiring structure 110.

A second interlayer insulating film 160 may be formed on the first etch stop film 155. The second interlayer insulating film 160 may include an upper wiring trench 210*t*. The upper wiring trench 210*t* may include an upper via trench 210V_t and an upper wiring line trench 210L_t.

The upper wiring trench 210*t* may penetrate through the first etch stop film 155. After the first etch stop film 155 is removed, the exposed lower capping film 114 may be removed. A portion of the lower capping film 114 disposed between the first etch stop film 155 and the lower filling film 113 may be removed. The lower capping film 114 may be undercut to a lower portion of the first etch stop film 155. The upper wiring trench 210*t* exposes a portion of an upper surface 113US of the lower filling film.

Figure 29:
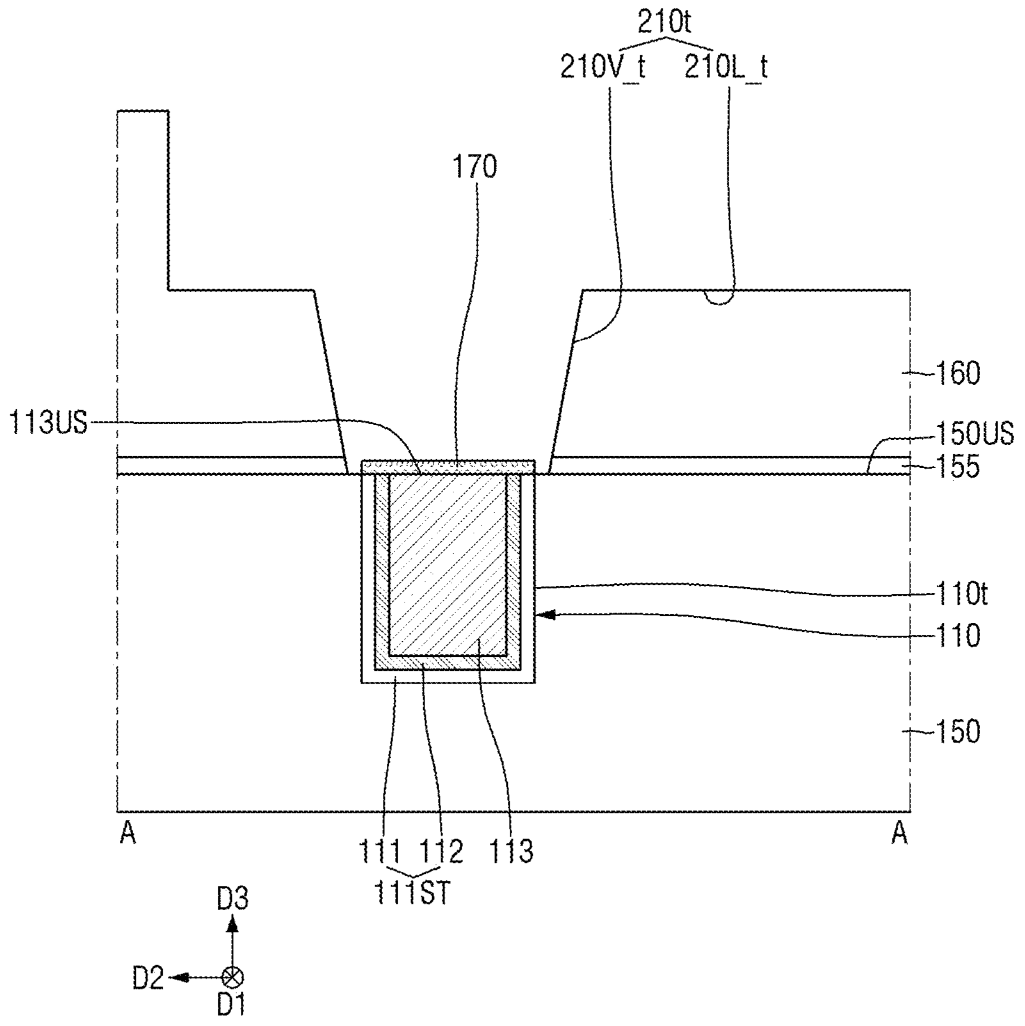

Referring to FIG. 29, a selective suppression film 170 is formed on the lower wiring structure exposed by the upper wiring trench 210*t*.

The selective suppression film 170 may be formed on a conductive material. The selective suppression film 170 is not formed on an insulating material.

The selective suppression film 170 may be formed on the upper surface 113US of the lower filling film, the upper surface of the lower liner 112, and the upper surface of the lower barrier film 111. Unlike as illustrated, the selective suppression film 170 may not be formed on the upper surface of the lower barrier film 111 and/or the upper surface of the lower liner 112.

The selective suppression film 170 includes an organic material. The selective suppression film 170 may limit and/or prevent a conductive material from being deposited on a surface on which the selective suppression film 170 is formed.

Figure 30:
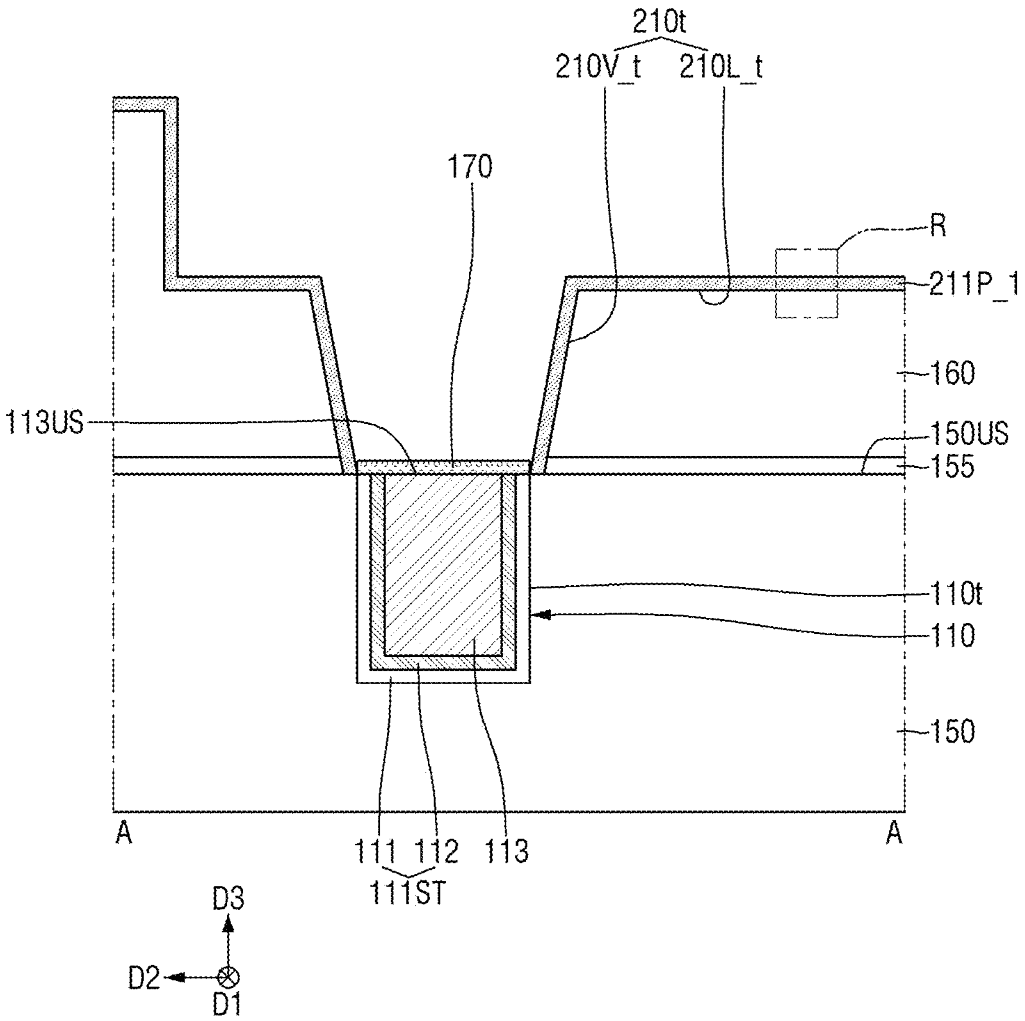
Figure 31:
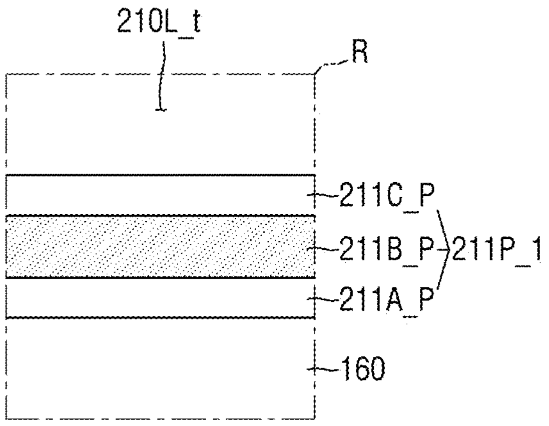

Referring to FIGS. 30 and 31, in a state in which the selective suppression film 170 is formed, a first pre lower barrier film 211P_1 is formed along a sidewall of the upper wiring trench 210*t*. The first pre lower barrier film 211P_1 is formed along the upper surface of the second interlayer insulating film 160.

The first pre lower barrier film 211P_1 is not formed on the lower wiring structure 110 on which the selective suppression film 170 is formed. The first pre lower barrier film 211P_1 may not be formed along the bottom surface of the upper wiring trench 210*t*. The first pre lower barrier film 211P_1 may be formed on an entire sidewall of the upper wiring trench 210*t*.

The first pre lower barrier film 211P_1 may include a first sub-lower barrier film 211A_P, a second sub-lower barrier film 211B_P, and a third sub-lower barrier film 211C_P. The first sub-lower barrier film 211A_P, the second sub-lower barrier film 211B_P, and the third sub-lower barrier film 211C_P may be sequentially formed along the sidewall of the upper wiring trench 210*t*. The second sub-lower barrier film 211B_P is formed between the first sub-lower barrier film 211A_P and the third sub-lower barrier film 211C_P.

The first sub-lower barrier film 211A_P and the third sub-lower barrier film 211C_P may be, for example, tantalum nitride films. The second sub-lower barrier film 211B_P may be a ruthenium film. The first sub-lower barrier film 211A_P, the second sub-lower barrier film 211B_P, and the third sub-lower barrier film 211C_P are each formed using atomic layer deposition (ALD). During the manufacturing process, ruthenium (Ru) included in the second sub-lower barrier film 211B_P is diffused into the tantalum nitride film, so that tantalum nitride (TaN) doped with ruthenium (Ru) may be formed.

Unlike as illustrated, the second sub-lower barrier film 211B_P and the third sub-lower barrier film 211C_P of the films included in the first pre lower barrier film 211P_1 may be formed along the bottom surface of the upper wiring trench 210*t*. The first sub-lower barrier film 211A_P may not be formed along the bottom surface of the upper wiring trench 210*t*.

Figure 32:
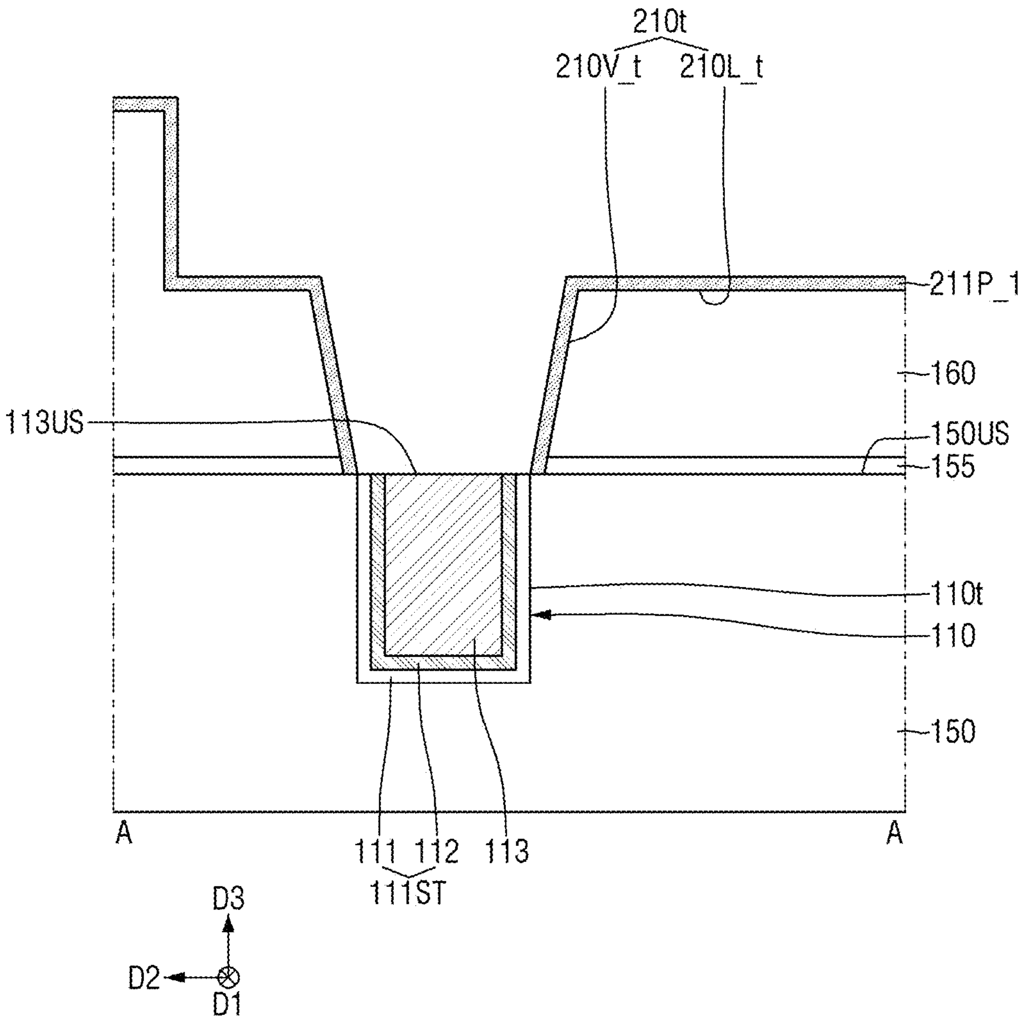

Referring to FIG. 32, the selective suppression film 170 may be removed to expose the lower wiring structure 110.

The selective suppression film 170 may be removed through, for example, plasma processing, but is not limited thereto.

Figure 33:
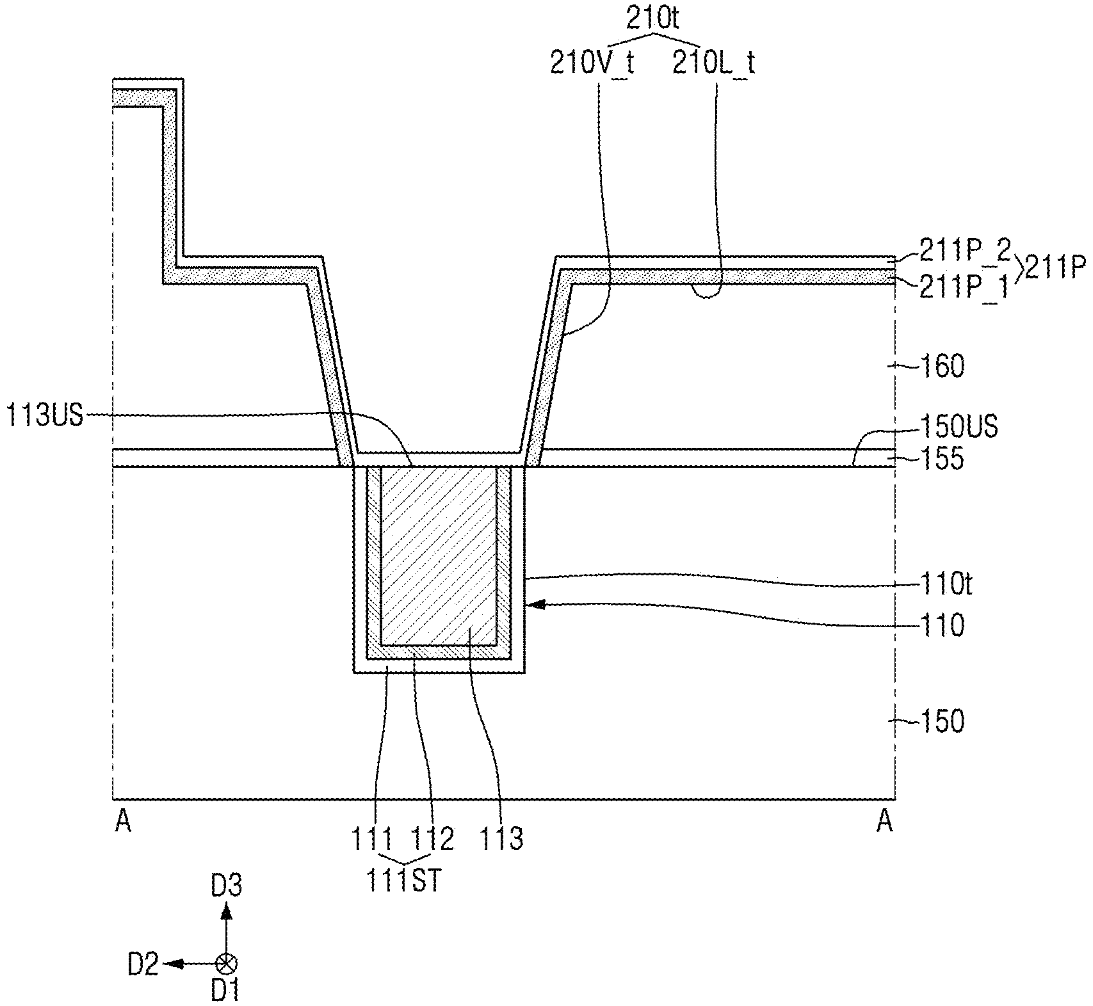

Referring to FIG. 33, a second pre lower barrier film 211P_2 may be formed on the first pre lower barrier film 211P_1.

The second pre lower barrier film 211P_2 may be formed along the sidewalls of the upper wiring trench 210*t* and the bottom surface of the upper wiring trench 210*t*. The pre lower barrier film 211P may include the first pre lower barrier film 211P_1 and the second pre lower barrier film 211P_2.

The second pre lower barrier film 211P_2 may be formed using, for example, physical vapor deposition (PVD), but is not limited thereto. The second pre lower barrier film 211P_2 may be a tantalum nitride film.

Unlike as illustrated, the second pre lower barrier film 211P_2 may not be formed. In this case, the first pre lower barrier film 211P_1 may become the pre lower barrier film.

Subsequently, referring to FIGS. 2 and 33, a pre upper liner and a pre upper filling film may be formed on the pre lower barrier film 211P.

The pre lower barrier film 211P, the pre upper liner, and the pre upper filling film disposed on the upper surface of the second interlayer insulating film 160 may be removed. As a result, the upper barrier film 211, the upper liner 212, and the upper filling film 213 may be formed in the upper wiring trench 210*t*.

While some example embodiments of the present disclosure have been described above with reference to the accompanying drawings, inventive concepts may be implemented in various different forms. Those skilled in the art to which the present disclosure pertains may understand that embodiments of inventive concepts may be implemented in other specific forms without departing from the spirit and scope of inventive concepts. Therefore, it should be understood that the example embodiments described above are illustrative in all aspects and not restrictive.

What is claimed is:

1. A semiconductor device comprising:

a lower interlayer insulating film including a lower wiring trench;

a lower wiring structure including a lower barrier film, a lower liner, a lower filling film, and a lower capping film sequentially disposed on the lower wiring trench, the lower capping film including an upper surface and a bottom surface opposite each other, and the bottom surface of the lower capping film being in contact with an upper surface of the lower filling film;

an etch stop film on the lower interlayer insulating film, the etch stop film in contact with an upper surface of the lower interlayer insulating film and the upper surface of the lower capping film;

an upper interlayer insulating film on the etch stop film, the upper interlayer insulating film including an upper wiring trench; and an upper wiring structure in the upper wiring trench and in contact with the lower filling film, wherein the upper wiring structure includes an upper barrier film, an upper filling film, and an upper liner between the upper barrier film and the upper filling film, the upper liner includes a sidewall portion and a bottom portion, the sidewall portion of the upper liner extends along a sidewall of the upper wiring trench, the bottom portion of the upper liner extends along a bottom surface of the upper wiring trench, the upper liner includes cobalt (Co), the upper barrier film includes a sidewall portion extending along the sidewall of the upper wiring trench, and the sidewall portion of the upper barrier film includes tantalum nitride doped with ruthenium (Ru), and an upper surface of the lower barrier film is not in contact with the lower capping film.

2. The semiconductor device of claim 1, wherein the bottom portion of the upper liner is in contact with the lower filling film.

3. The semiconductor device of claim 1, wherein the upper barrier film further includes a bottom portion extending along the bottom surface of the upper wiring trench, and the bottom portion of the upper barrier film includes tantalum nitride.

4. The semiconductor device of claim 3, wherein a thickness of the sidewall portion of the upper barrier film is equal to or greater than a thickness of the bottom portion of the upper barrier film.

5. The semiconductor device of claim 1, wherein the upper barrier film further includes a bottom portion extending along the bottom surface of the upper wiring trench, the bottom portion of the upper barrier film includes tantalum nitride doped with ruthenium.

6. The semiconductor device of claim 1, wherein the upper liner is cobalt.

7. The semiconductor device of claim 1, wherein the upper liner includes cobalt doped with ruthenium.

8. The semiconductor device of claim 7, wherein the sidewall portion of the upper liner includes cobalt doped with ruthenium, and the bottom portion of the upper liner includes cobalt.

9. The semiconductor device of claim 1, wherein the sidewall portion of the upper barrier film is not in contact with the lower capping film.

10. The semiconductor device of claim 1, wherein the upper surface of the lower filling film in contact with the upper wiring structure has a concave curved shape in a cross-sectional view.

11. The semiconductor device of claim 1, wherein the upper surface of the lower filling film in contact with the upper wiring structure has a planar shape in a cross-sectional view.

12. A semiconductor device comprising:

a lower wiring structure including a lower filling film and a lower capping film, an upper surface of the lower filling film including a first region in contact with the lower capping film and a second region that is not in contact with the lower capping film;

an upper interlayer insulating film on the lower wiring structure and including an upper wiring trench, the upper wiring trench including an upper wiring line trench and an upper via trench on a bottom surface of the upper wiring line trench, and a bottom surface of the upper via trench overlapping the second region of the upper surface of the lower filling film; and an upper wiring structure in the upper wiring trench, the upper wiring structure including an upper barrier structure and an upper filling film on the upper barrier structure, wherein the upper barrier structure includes a sidewall portion and a bottom portion, the sidewall portion of the upper barrier structure extends along sidewalls of the upper wiring line trench, the bottom surface of the upper wiring line trench, and sidewalls of the upper via trench, the bottom portion of the upper barrier structure extends along a bottom surface of the upper via trench, the upper barrier structure includes an upper barrier film and an upper liner between the upper barrier film and the upper filling film, the upper liner includes cobalt, the sidewall portion of the upper barrier structure includes tantalum nitride (TaN) doped with ruthenium (Ru), and the bottom portion of the upper barrier structure does not include tantalum nitride doped with ruthenium.

13. The semiconductor device of claim 12, wherein the upper liner includes a sidewall portion and a bottom portion, the sidewall portion of the upper liner extends along the sidewalls of the upper wiring line trench, the bottom surface of the upper wiring line trench, and the sidewalls of the upper via trench, and the bottom portion extends along the bottom surface of the upper via trench.

14. The semiconductor device of claim 13, wherein the upper liner includes cobalt doped with ruthenium.

15. The semiconductor device of claim 14, wherein the sidewall portion of the upper liner includes cobalt doped with ruthenium, and the bottom portion of the upper liner does not include cobalt doped with ruthenium.

16. The semiconductor device of claim 12, wherein the upper barrier film extends along the sidewalls of the upper wiring line trench, the bottom surface of the upper wiring line trench, and the sidewalls of the upper via trench, the upper barrier film does not extend along the bottom surface of the upper via trench, and the upper barrier film is tantalum nitride doped with ruthenium.

17. The semiconductor device of claim 12, wherein the upper barrier film includes a sidewall portion and a bottom portion, the sidewall portion of the upper barrier film extends along the sidewalls of the upper wiring line trench, the bottom surface of the upper wiring line trench, and the sidewalls of the upper via trench, a bottom portion of the upper wiring line trench extends along the bottom surface of the upper via trench, the sidewall portion of the upper barrier film includes tantalum nitride doped with ruthenium, and the bottom portion of the upper barrier film includes tantalum nitride.

18. The semiconductor device of claim 17, wherein a thickness of the upper barrier film on the sidewalls of the upper via trench is equal to a thickness of the upper barrier film on the bottom surface of the upper via trench.

19. A semiconductor device comprising:

a lower wiring structure including a lower filling film and a lower capping film, the lower capping film including a capping opening exposing a portion of an upper surface of the lower filling film;

an upper interlayer insulating film on the lower wiring structure, the upper interlayer insulating film including an upper wiring trench; and an upper wiring structure in the upper wiring trench, the upper wiring structure in contact with the upper surface of the lower filling film, wherein the upper wiring structure includes an upper barrier film, an upper filling film, and an upper liner between the upper barrier film and the upper filling film, the upper liner includes a sidewall portion extending along sidewalls of the upper wiring trench and a bottom portion extending along a bottom surface of the upper wiring trench, the sidewall portion of the upper liner includes cobalt doped with ruthenium, the bottom portion of the upper liner does not include cobalt doped with ruthenium, the upper barrier film includes a sidewall portion extending along the sidewalls of the upper wiring trench, the sidewall portion of the upper barrier film includes tantalum nitride doped with ruthenium (Ru), and the sidewall portion of the upper barrier film is not in contact with the lower capping film.

20. The semiconductor device of claim 19, wherein the upper barrier film further includes a bottom portion extending along the bottom surface of the upper wiring trench, and the bottom portion of the upper barrier film is tantalum nitride.

* * * * *